(12) United States Patent
Kim et al.

(10) Patent No.: US 10,910,382 B2
(45) Date of Patent: Feb. 2, 2021

(54) METHOD FOR FABRICATING SEMICONDUCTOR DEVICE

(71) Applicant: SAMSUNG ELECTRONICS CO., LTD., Suwon-si (KR)

(72) Inventors: Hui-Jung Kim, Seongnam-si (KR); Keun Nam Kim, Yongin-si (KR); Yoo Sang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/661,234

(22) Filed: Oct. 23, 2019

(65) Prior Publication Data
US 2020/0203148 A1    Jun. 25, 2020

(30) Foreign Application Priority Data
Dec. 20, 2018 (KR) .................. 10-2018-0165777

(51) Int. Cl.
| | |
|---|---|
| *H01L 27/108* | (2006.01) |
| *H01L 49/02* | (2006.01) |
| *H01L 23/522* | (2006.01) |
| *H01L 21/311* | (2006.01) |

(52) U.S. Cl.
CPC .. *H01L 27/10852* (2013.01); *H01L 21/31144* (2013.01); *H01L 23/5223* (2013.01); *H01L 27/10814* (2013.01); *H01L 28/90* (2013.01); *H01L 28/91* (2013.01)

(58) Field of Classification Search
CPC ......... H01L 27/10852; H01L 27/10814; H01L 27/10811; H01L 27/1085; H01L 27/10858; H01L 27/10817; H01L 28/90; H01L 28/91; H01L 28/60; H01L 23/5223; H01L 21/31144; H01L 21/31116; H01L 21/31138
See application file for complete search history.

(56) References Cited

U.S. PATENT DOCUMENTS

| | | | |
|---|---|---|---|
| 8,169,012 B2 | 5/2012 | Bae et al. | |
| 8,395,235 B2 | 3/2013 | Tsuchiya | |
| 8,637,364 B2 * | 1/2014 | Ueda ................. | H01L 21/31116 438/241 |

(Continued)

FOREIGN PATENT DOCUMENTS

JP       2011-003598 A       1/2011

*Primary Examiner* — Michael M Trinh
(74) *Attorney, Agent, or Firm* — Lee IP Law, P.C.

(57) ABSTRACT

A method for fabricating a semiconductor device includes stacking a first mold layer and a first supporter layer, forming a first supporter pattern by etching the first supporter layer to expose the first mold layer, forming an insulating layer to cover the exposed first mold layer and the first supporter pattern, stacking a second mold layer and a second supporter layer on the insulating layer, forming a contact hole by dry-etching the second supporter layer, the second mold layer, the insulating layer, the first supporter pattern, and the first mold layer, forming a lower electrode within the contact hole, removing the first mold layer, the second mold layer, and the insulating layer, and forming an upper electrode on the lower electrode and the first supporter pattern, wherein, during the dry-etching, dry etching rates of the first supporter pattern and the insulating layer are the same.

20 Claims, 29 Drawing Sheets

(56) References Cited

U.S. PATENT DOCUMENTS

| | | |
|---|---|---|
| 8,815,697 B2 | 8/2014 | Yoon et al. |
| 8,970,039 B2 | 3/2015 | Kuh et al. |
| 9,184,167 B2 | 11/2015 | Song et al. |
| 9,240,441 B2 * | 1/2016 | Yoon ........................ H01L 28/91 |
| 9,287,349 B2 * | 3/2016 | Kim .................... H01L 27/10852 |
| 2013/0147048 A1 * | 6/2013 | Kuh .................. H01L 27/10814 |
| | | 257/768 |
| 2015/0270330 A1 * | 9/2015 | Lee ........................ H04L 28/60 |
| | | 438/381 |
| 2016/0104618 A1 * | 4/2016 | Hong ................. H01L 21/0332 |
| | | 438/396 |
| 2018/0166320 A1 * | 6/2018 | Kim ................. H01L 27/10808 |
| 2019/0027376 A1 * | 1/2019 | Yoon ..................... H01L 21/304 |

\* cited by examiner

FIG. 1
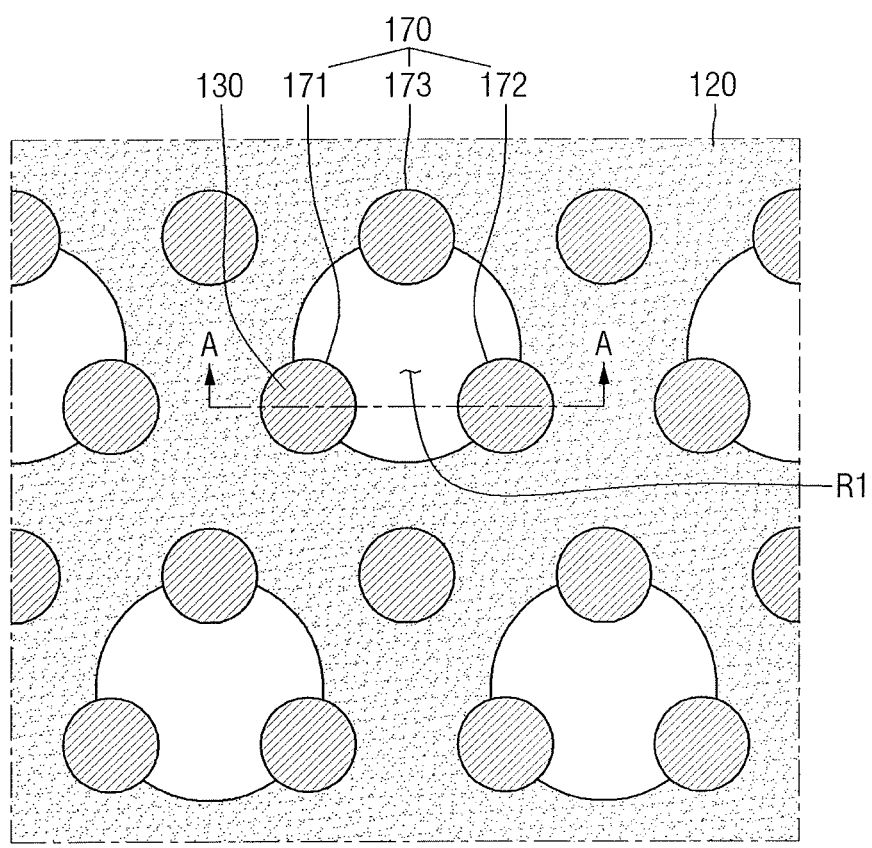
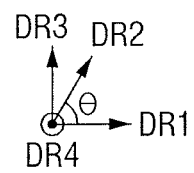

FIG. 29
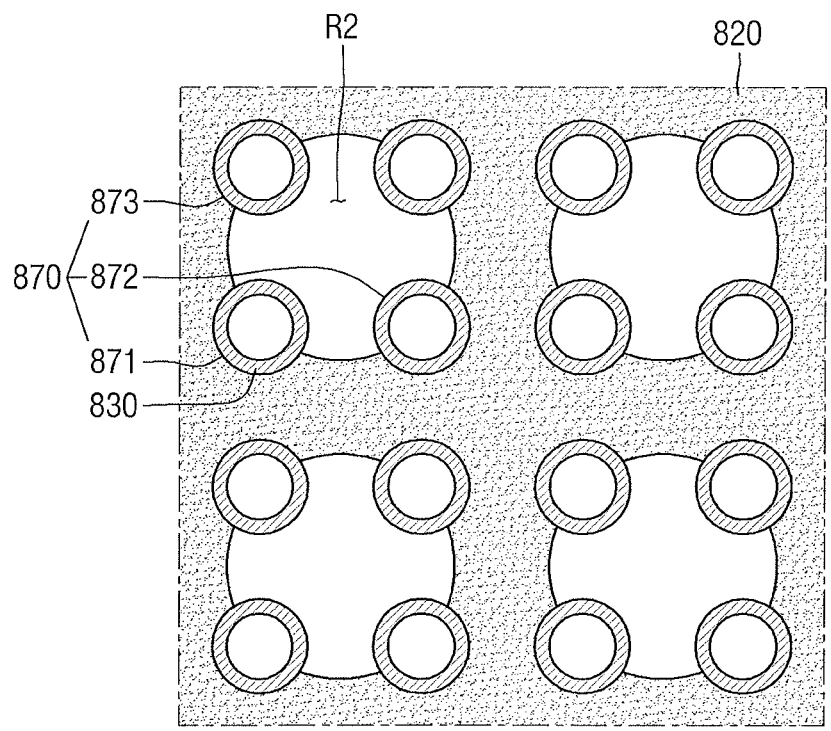
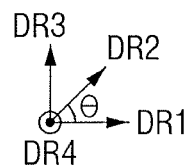

METHOD FOR FABRICATING SEMICONDUCTOR DEVICE

CROSS-REFERENCE TO RELATED APPLICATION

Korean Patent Application No. 10-2018-0165777, filed on Dec. 20, 2018, in the Korean Intellectual Property Office, and entitled: "Method for Fabricating Semiconductor Device," is incorporated by reference herein in its entirety.

BACKGROUND

1. Field

The present disclosure relates to a method for fabricating a semiconductor device.

2. Description of the Related Art

As high-density integration of memory products is accelerated by the recent rapid development of miniaturized semiconductor processing technology, a unit cell area is greatly reduced and an operating voltage is lowered. For example, in the case of a semiconductor element, e.g., a dynamic random-access memory (DRAM), a degree of integration increases and an area occupied by the element is reduced, whereas necessary capacitance is required to be maintained or increased.

SUMMARY

According to an exemplary embodiment of the present disclosure, there is provided a method for fabricating a semiconductor device, including stacking a first mold layer and a first supporter layer on a substrate sequentially, forming a first supporter pattern by etching the first supporter layer so as to expose at least a portion of an upper surface of the first mold layer, forming an insulating layer so as to cover exposed the upper surface of the first mold layer and the first supporter pattern, stacking a second mold layer and a second supporter layer on the insulating layer sequentially, forming a contact hole by dry-etching the second supporter layer, the second mold layer, the insulating layer, at least a portion of the first supporter pattern and the first mold layer through a mask pattern, forming a lower electrode within the contact hole, removing the first mold layer, the second mold layer and the insulating layer, and forming an upper electrode on the lower electrode and the first supporter pattern, wherein, during the dry-etching, a dry etching rate of the first supporter pattern is the same as a dry etching rate of the insulating layer.

According to an exemplary embodiment of the present disclosure, there is provided a method for fabricating a semiconductor device, including stacking a first mold layer and a first supporter layer on a substrate sequentially, forming a first supporter pattern by etching the first supporter layer so as to expose at least a portion of an upper surface of the first mold layer, forming a first insulating layer so as to cover exposed the upper surface of the first mold layer and the first supporter pattern, stacking a second mold layer, a second supporter layer, a third mold layer and a third supporter layer on the first insulating layer sequentially, forming a contact hole by dry-etching the third supporter layer, the third mold layer, the second supporter layer, the second mold layer, the first insulating layer, at least a portion of the first supporter pattern and the first mold layer in utilization of a mask pattern as a mask, forming a lower electrode within the contact hole, and removing the first mold layer, the second mold layer, the third mold layer and the first insulating layer, wherein, during the dry-etching, a dry etching rate of the first supporter pattern is the same as a dry etching rate of the first insulating layer.

According to an exemplary embodiment of the present disclosure, there is provided a method for fabricating a semiconductor device, including stacking a first mold layer and a first supporter layer including silicon oxycarbide (SiOC) on a substrate sequentially, forming a first supporter pattern by etching the first supporter layer so as to expose at least a portion of an upper surface of the first mold layer, stacking a second mold layer and a second supporter layer on the first supporter pattern sequentially, forming a contact hole by dry-etching the second supporter layer, the second mold layer, at least a portion of the first supporter pattern and the first mold layer in utilization of a mask pattern as a mask, forming a lower electrode within the contact hole, and removing the first mold layer and the second mold layer, wherein, during the dry-etching, a dry etching rate of the first supporter pattern is the same as a dry etching rate of the first mold layer.

According to an exemplary embodiment of the present disclosure, there is provided a method for fabricating a semiconductor device, including stacking a first mold layer and a first supporter layer on a substrate sequentially, forming a first supporter pattern by etching the first supporter layer so as to expose at least a portion of an upper surface of the first mold layer, forming an insulating layer so as to cover exposed the upper surface of the first mold layer and the first supporter pattern, stacking a second mold layer and a second supporter layer on the insulating layer sequentially, forming a contact hole by dry-etching the second supporter layer, the second mold layer, the insulating layer, at least a portion of the first supporter pattern and the first mold layer in utilization of a mask pattern as a mask, forming a lower electrode within the contact hole, and removing the first mold layer, the second mold layer and the insulating layer, wherein the insulating layer and the first mold layer include a same material as each other and the first supporter layer includes silicon oxycarbide (SiOC).

BRIEF DESCRIPTION OF THE DRAWINGS

Features will become apparent to those of skill in the art by describing in detail exemplary embodiments with reference to the attached drawings, in which:

FIG. 1 illustrates a plan view of a semiconductor device fabricated by a method for fabricating a semiconductor device according to some exemplary embodiments;

FIG. 29 illustrates a plan view of a semiconductor device fabricated by a method for fabricating a semiconductor device according to some other exemplary embodiments.

DETAILED DESCRIPTION

Hereinafter, with reference to FIG. 1 and FIG. 2, a semiconductor device fabricated by a method for fabricating a semiconductor device according to some exemplary embodiments of the present disclosure will be described.

FIG. 1 is a view provided to explain a semiconductor device fabricated by a method for fabricating a semiconductor device according to some exemplary embodiments. FIG. 2 is a cross-sectional view taken along line A-A of FIG. 1. However, a capacitor dielectric layer 135 and an upper electrode 140 are omitted from FIG. 1 for convenience of explanation.

Figure 2:
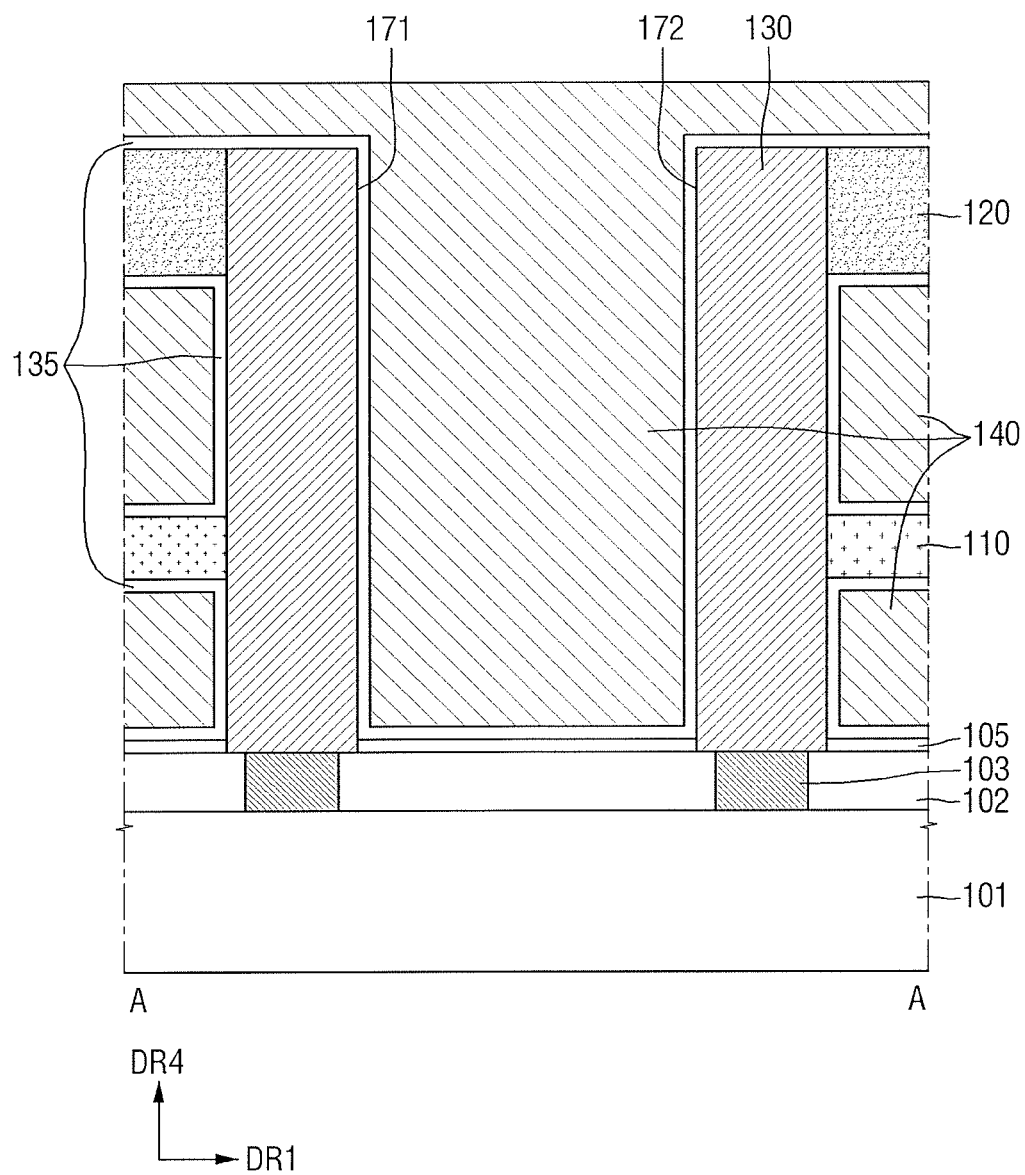
FIG. 2 illustrates a cross-sectional view along line A-A of FIG. 1.

Referring to FIG. 1 and FIG. 2, the semiconductor device fabricated by the method for fabricating the semiconductor device according to some exemplary embodiments may include a substrate 101, an interlayer insulating layer 102, a contact plug 103, an etch stop layer 105, a first supporter 110, a second supporter 120, a lower electrode 130, a capacitor dielectric layer 135, and an upper electrode 140.

The substrate 101 may be a structure in which a base substrate and an epi-layer are stacked one on the other, although the present disclosure is not limited thereto. That is, in some other exemplary embodiments, the substrate 101 may be any one of a silicon substrate, a gallium arsenide substrate, a silicon germanium substrate, a ceramic substrate, a quartz substrate, or a glass substrate for display, and a semiconductor on insulator (SOI) substrate. Hereinbelow, the silicon substrate will be described as an example. The substrate 101 may be a first conductivity type (e.g., a P type), although the present disclosure is not limited thereto.

Although not illustrated, a gate electrode used as a word line may be disposed within the substrate 100. A unit activation region and an element isolation region may be formed on the substrate 101. For example, two transistors may be formed within a single unit activation region.

The interlayer insulating layer 102 may be formed on the substrate 101. The interlayer insulating layer 102 may include, e.g., at least one of silicon oxide ($SiO_2$), silicon nitride (SiN), and silicon oxynitride (SiON). The interlayer insulating layer 102 may be a single layer or a multi-layer.

The contact plug 103 may be formed within the interlayer insulating layer 102 to penetrate through the interlayer insulating layer 102. The contact plug 103 may be electrically connected with a source/drain region formed in the substrate 101. The contact plug 103 may include a conductive material, and for example, may include at least one of poly crystal silicon, a metal silicide compound, conductive metal nitride, and metal. However, the present disclosure is not limited thereto.

The semiconductor device may include a plurality of contact holes 170 which are disposed to be spaced apart from one another. For example, a second contact hole 172 may be disposed to be spaced apart from a first contact hole 171 in a first direction DR1. Further, a third contact hole 173 may be disposed to be spaced apart from the first contact hole 171 in a second direction DR2.

An angle θ formed by the first direction DR1 and the second direction DR2 may be an acute angle. For example, the angle θ formed by the first direction DR1 and the second direction DR2 may be 60 degrees. In this case, the plurality of contact holes 170 may be respectively disposed at a vertex and a center of a honeycomb-shaped hexagon.

Although it is illustrated in FIG. 1 that the plurality of contact holes 170 are respectively spaced apart from one another by a same pitch, the present disclosure is not limited thereto. That is, in some other exemplary embodiments, at least one of the respective spaced pitches of the plurality of contact holes 170 may be different. Each of the plurality of contact holes 170 may be formed to extend in a fourth direction DR4 perpendicular to an upper surface of the substrate 101.

Each of the plurality of contact holes 170 may include the lower electrode 130 which is disposed therewithin. In this case, the lower electrode 130 may be disposed to completely fill an inner portion of each of the plurality of contact holes 170. That is, the lower electrode 130 may have a pillar shape. However, the present disclosure is not limited thereto.

The lower electrode 130 may be disposed within each of the plurality of contact holes 170. The lower electrode 130 may be disposed to extend in the fourth direction DR4 on the substrate 101. The lower electrode 130 may be disposed on the contact plug 103 disposed within the interlayer insulating layer 102. The lower electrode 130 may be electrically connected with the contact plug 103. The lower electrode 130 may include at least one of doped poly silicon, conductive metal nitride (e.g., titanium nitride, tantalum nitride, tungsten nitride, or the like), metal (e.g., ruthenium, iridium, titanium, tantalum, or the like), and conductive metal oxide (e.g., iridium oxide or the like).

The etch stop layer 105 may be disposed on the interlayer insulating layer 102. The etch stop layer 105 may be disposed to wrap a portion of a sidewall of the lower electrode 130 which is formed adjacently to an upper surface of the interlayer insulating layer 102. The etch stop layer 105 may include a material having etch selectivity with respect to a first mold layer 151 of FIG. 9 and a second mold layer 152 including oxide. The etch stop layer 105 may include, e.g., silicon nitride (SiN), although the present disclosure is not limited thereto.

A plurality of supporters 110, 120 may support the lower electrode 130. For example, referring to FIGS. 1-2, the first and second supporters 110 and 120 may have same shapes in a plan view and completely overlap each other, e.g., so the first supporter 110 may have a same shape as the second supporter 120 in FIG. 1 (and is completely covered by the second supporter 102, and therefore, not seen in FIG. 1).

In detail, the first supporter 110, which is a lower supporter, may be disposed on the substrate 101 to support the lower electrode 130. The first supporter 110 may include an open region R1 therethrough to expose a portion of the capacitor dielectric layer 135 disposed on a sidewall of the plurality of lower electrodes 130 and a support region to wrap a portion of the other of the sidewall of the plurality of lower electrodes 130. The first supporter 110 may support the plurality of lower electrodes 130 by using the support region. Although FIG. 1 illustrates the lower electrode 130 in which the open region R1 is not formed, the present disclosure is not limited thereto.

The open region R1 of the first supporter 110 may have a circular shape. However, the present disclosure is not limited thereto. That is, in some other exemplary embodiments, the open region R1 of the first supporter 110 may have, e.g., a rectangular shape or a parallelogrammic shape.

The second supporter 120, which is an upper supporter, may be disposed on the first supporter 110 to support the lower electrode 130. The second supporter 120 may include an open region to expose a portion of the capacitor dielectric layer 135 disposed on a sidewall of the plurality of lower electrodes 130 and a support region to wrap a portion of the other of the sidewall of the plurality of lower electrodes 130. The second supporter 120 may support the plurality of lower electrodes 130 by using the support region.

The open region of the second supporter 120 may have a same shape in a plan view as the open region R1 of the first supporter 110, and may completely overlap the open region R1 of the first supporter 110, e.g., the open region of the second supporter 120 and the open region R1 of the first supporter 110 may be in fluid communication with each other to define a combined single space (FIG. 10). open region of the second supporter 120 may have a circular shape. However, the present disclosure is not limited thereto. That is, in some other exemplary embodiments, the open region of the second supporter 120 may have, e.g., a rectangular shape or a parallelogrammic shape.

The first supporter 110 and the second supporter 120 may be disposed between the adjacent lower electrodes 130. However, the first supporter 110 and the second supporter 120 may not be disposed in the open region R1, as illustrated in FIG. 1 and FIG. 2. For example, the first supporter 110 and the second supporter 120 may be in direct contact with the lower electrode 130. However, the present disclosure is not limited thereto.

The first supporter 110 and the second supporter 120 may be disposed to be spaced apart from each other. In detail, the first supporter 110 and the second supporter 120 may be disposed to be spaced apart from each other in the fourth direction DR4 in which the lower electrode 130 extends, e.g., the first and second supporters 110 and 120 may be separated by the upper electrode 140. For example, the first supporter 110 may be disposed closer to an upper surface of the substrate 101 rather than the second supporter 120, i.e., a distance along the fourth direction DR4 between the first supporter 110 and the upper surface of the substrate 101 may be smaller than a distance along the fourth direction DR4 between the second supporter 120 and the upper surface of the substrate 101.

The first supporter 110 may include, e.g., silicon oxycarbide (SiOC). However, the present disclosure is not limited thereto. The second supporter 120 may include, e.g., at least one of silicon oxynitride (SiON), silicon nitride (SiN), silicon carbon nitride (SiCN), and tantalum oxide (TaO).

A height from the upper surface of the substrate 101 to an upper surface of the lower electrode 130, e.g., along the fourth direction DR4, may be equal to a height from the upper surface of the substrate 101 to an upper surface of the second supporter 120. That is, an uppermost portion, e.g., surface, of the lower electrode 130 and an upper surface of the second supporter 120 may be formed on a same plane, e.g., level with each other. However, the present disclosure is not limited thereto.

The capacitor dielectric layer 135 may be conformally disposed on the lower electrode 130, the first supporter 110, the second supporter 120, and the etch stop layer 105. In detail, the capacitor dielectric layer 135 may be disposed along a sidewall and an upper surface of the lower electrode 130. The capacitor dielectric layer 135 may be disposed along an upper surface and a lower surface of the first supporter 110. The capacitor dielectric layer 135 may be disposed along an upper surface and a lower surface of the second supporter 120. The capacitor dielectric layer 135 may be disposed along an upper surface of the etch stop layer 105. The capacitor dielectric layer 135 may be formed of a single layer or a multi-layer.

The capacitor dielectric layer 135 may include at least one of, e.g., silicon oxide ($SiO_2$), silicon nitride (SiN), silicon oxynitride (SiON), and a high-k dielectric material. For example, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, although the present disclosure is not limited thereto.

The upper electrode 140 may be disposed on the capacitor dielectric layer 135. In detail, the upper electrode 140 may be disposed between the adjacent lower electrodes 130 (e.g., in the first and second directions DR1 and DR2), between the first supporter 110 and the second supporter 120 (e.g., in the fourth direction DR4), and between the first supporter 110 and the etch stop layer 105 (e.g., in the fourth direction DR4). The upper electrode 140 may include, e.g., at least one of doped poly silicon, metal, conductive metal nitride, and metal silicide.

Hereinbelow, a method for fabricating a semiconductor device according to some exemplary embodiments will be described with reference to FIG. 2 to FIG. 11. FIG. 3 to FIG. 11 are views illustrating intermediate stages of fabrication, provided to explain the method for fabricating a semiconductor device illustrated in FIG. 2 according to some exemplary embodiments.

Figure 3:
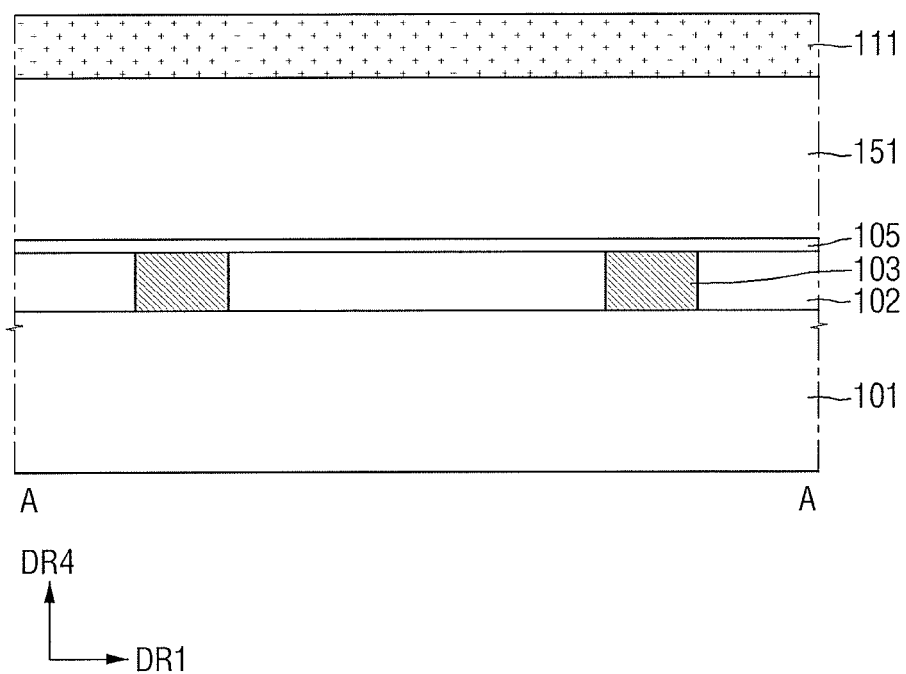
FIG. 3 to FIG. 11 illustrate cross-sectional views of stages in a method for fabricating the semiconductor device in FIG. 2 according to embodiments.

Referring to FIG. 3, the interlayer insulating layer 102 and the contact plug 103 penetrating through the interlayer insulating layer 102 in the fourth direction DR4 may be formed on the substrate 101. Subsequently, the etch stop layer 105, the first mold layer 151, and a first supporter layer 111 may be sequentially stacked on the interlayer insulating layer 102 and the contact plug 103.

In detail, the etch stop layer 105 may be conformally formed on the interlayer insulating layer 102 and the contact plug 103. The etch stop layer 105 may be formed by using, e.g., a chemical vapor deposition process, although the present disclosure is not limited thereto.

The first mold layer 151 may be formed on the etch stop layer 105. The first mold layer 151 may be formed by using, e.g., a chemical vapor deposition (CVD) process, although the present disclosure is not limited thereto. The first mold layer 151 may include silicon oxide ($SiO_2$), and for example, may include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP), plasma enhanced oxide (PEOX), flowable CVD (FCVD), or a combination thereof.

Although it is illustrated in FIG. 3 that the first mold layer 151 is formed as a single layer, the present disclosure is not limited thereto. That is, in some other exemplary embodiments, the first mold layer 151 may include two or more layers having different etching speeds.

The first supporter layer 111 may be formed on the first mold layer 151. The first supporter layer 111 may be formed by using, e.g., a chemical vapor deposition (CVD) process, although the present disclosure is not limited thereto.

The first supporter layer 111 may include, e.g., silicon oxycarbide (SiOC). Constituent materials of the first supporter layer 111 will be described in detail below.

Figure 4:
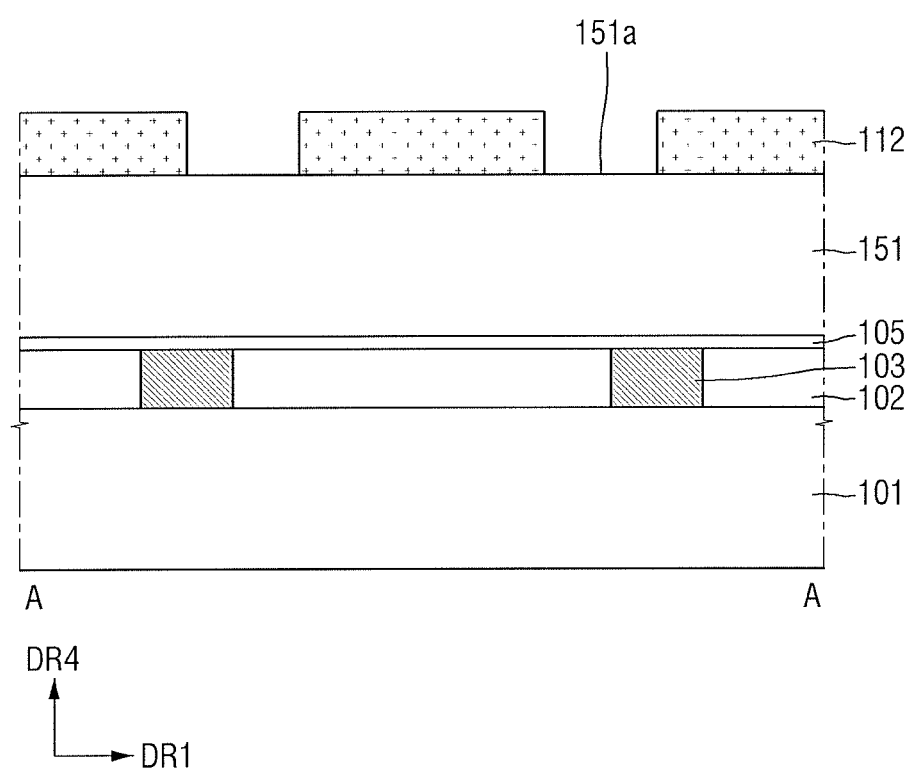

Referring to FIG. 4, a first supporter pattern 112 may be formed by etching the first supporter layer 111 of FIG. 3 so as to expose at least a portion of an upper surface 151a of the first mold layer 151. For example, the first supporter pattern 112 may include a plurality of portions spaced apart from each other along a horizontal direction, e.g., along the first and/or second directions DR1 and DR2, such that a region between every two adjacent portions of the first supporter pattern 112 exposes a portion of the upper surface 151a of the first mold layer 151. At least a portion of the exposed upper surface 151a of the first mold layer 151 may be formed to overlap the contact plug 103, e.g., along the fourth direction DR4.

Figure 5:
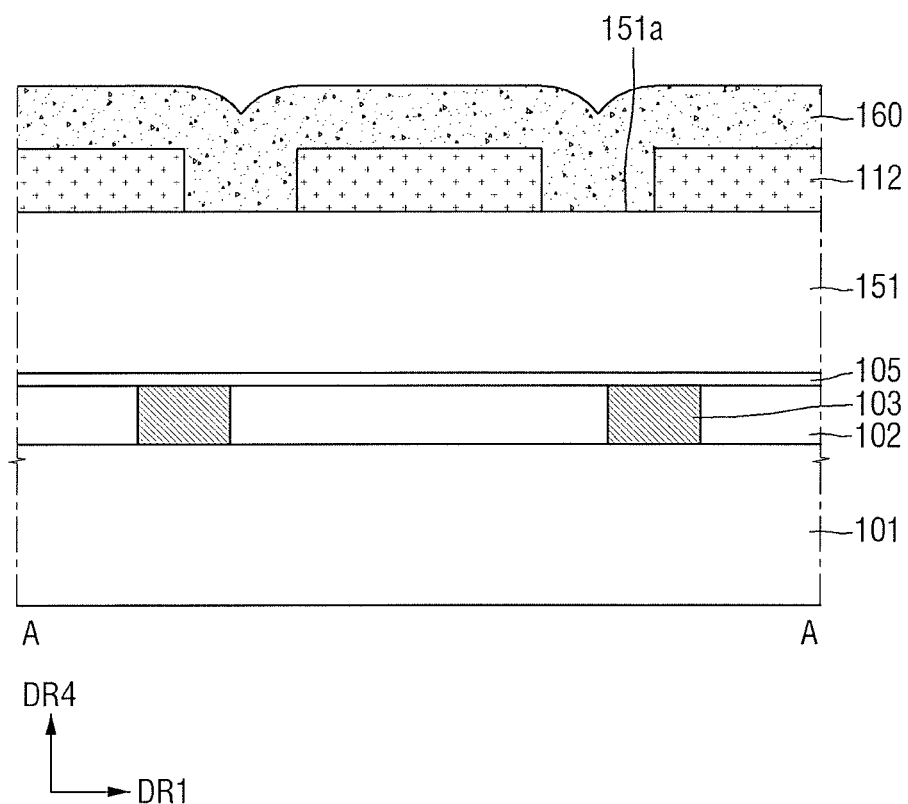

Referring to FIG. 5, a first insulating layer 160 may be formed to cover the exposed upper surface 151a of the first mold layer 151 and the first supporter pattern 112. The first insulating layer 160 may be formed with, e.g., an atomic layer deposition process. Accordingly, the first insulating layer 160 may be conformally formed on the exposed upper surface 151a of the first mold layer 151 and the first supporter pattern 112.

A lower surface of the first insulating layer 160 may be formed on a same plane as a lower surface of the first supporter pattern 112. However, the present disclosure is not limited thereto.

The first insulating layer 160 may be formed to completely fill a region between the first supporter pattern 112, e.g., the first insulating layer 160 may be formed to completely fill the region between the adjacent portions of the first supporter pattern 112. For example, the first insulating layer 160 may be formed by thickness, e.g., to a sufficient thickness along the fourth direction DR4 to exceed the thickness of the first supporter pattern 112 as measured from the upper surface 151a of the first mold layer 151, so as to completely fill a region between the first supporter pattern 112 with an atomic layer deposition process. Accordingly, void formation in the region between, e.g., adjacent portions of, the first supporter pattern 112 may be efficiently prevented.

The first insulating layer 160 may include a same material as the first mold layer 151. The first insulating layer 160 may include, e.g., silicon oxide ($SiO_2$). However, the present disclosure is not limited thereto.

Figure 6:
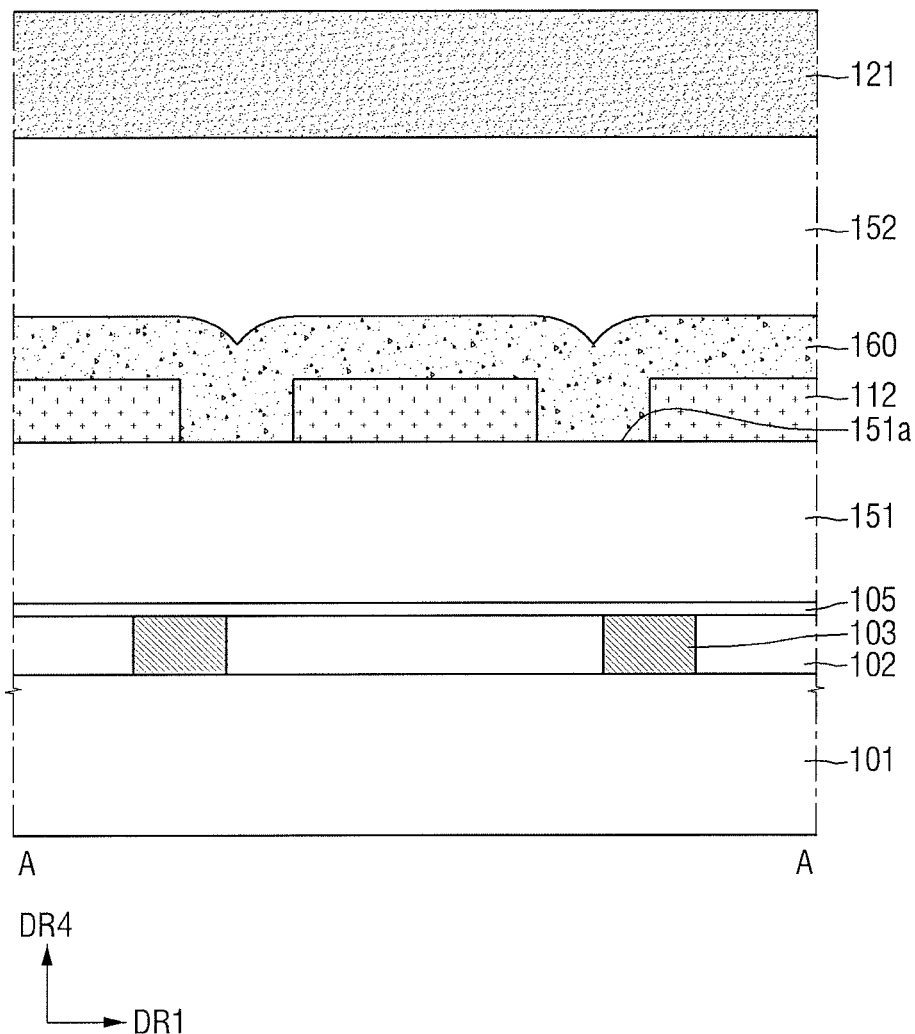

Referring to FIG. 6, a second mold layer 152 and a second supporter layer 121 may be sequentially stacked on the first insulating layer 160. In detail, the second mold layer 152 may be formed on the first insulating layer 160, e.g., so the first insulating layer 160 separates between the first and second mold layers 151 and 152.

The second mold layer 152 may be formed by using, e.g., a chemical vapor deposition process. That is, the second mold layer 152 may be formed by another process different from that of the first insulating layer 160. However, the present disclosure is not limited thereto. That is, according to some other exemplary embodiments, the first insulating layer 160 and the second mold layer 152 may be formed by using a same process, e.g., a chemical vapor deposition process.

The second mold layer 152 may include a same material as that of the first insulating layer 160. The second mold layer 152 may include silicon oxide ($SiO_2$), and for example, may include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP), plasma enhanced oxide (PEOX), flowable CVD (FCVD), or a combination thereof.

Although it is illustrated in FIG. 6 that the second mold layer 152 is formed as a single layer, the present disclosure is not limited thereto. That is, in some other exemplary embodiments, the second mold layer 152 may include two or more layers having different etching speeds.

The second supporter layer 121 may be formed on the second mold layer 152. The second supporter layer 121 may be formed by using, e.g., a chemical vapor deposition (CVD) process, although the present disclosure is not limited thereto. The second supporter layer 121 may include, e.g., at least one of silicon oxynitride (SiON), silicon nitride (SiN), silicon carbon nitride (SiCN), and tantalum oxide (TaO). Thickness in the fourth direction DR4 of the second supporter layer 121 may be formed to be greater than that in the fourth direction DR4 of the first supporter pattern 112, but the present disclosure is not limited thereto.

Figure 7:
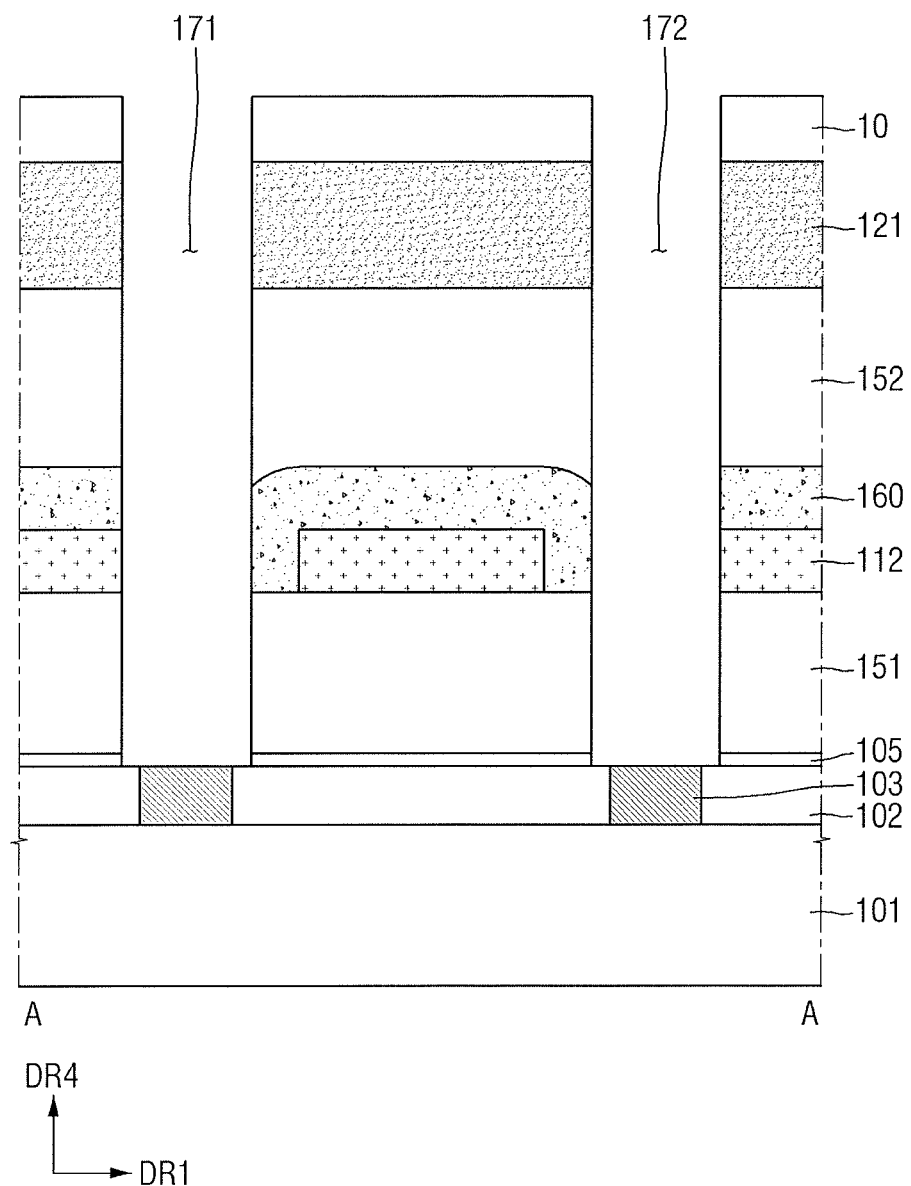

Referring to FIG. 7, the first contact hole 171 and the second contact hole 172 may be formed by etching the second supporter layer 121, the second mold layer 152, the first insulating layer 160, at least a portion of the first supporter pattern 112, the first mold layer 151, and the etch stop layer 105 in utilization of a first mask pattern 10 formed on the second supporter layer 121 as a mask. The first contact hole 171 and the second contact hole 172 may be formed by, e.g., a first dry etching. The contact plug 103 may be exposed through the first contact hole 171 and the second contact hole 172.

Etch selectivity of the first supporter pattern 112 and the first insulating layer 160 may be same as each other with respect to the first dry etching. That is, a first dry etching rate of the first supporter pattern 112 with respect to the first dry etching may be same as a second dry etching rate of the first insulating layer 160 with respect to the first dry etching. That is, when the first dry etching is performed, the first supporter pattern 112 and the first insulating layer 160 may be etched at a same speed.

Herein, sameness indicates a substantial same level that can be accepted by a person skilled in the art, and includes minute errors that can be ignored by a person skilled in the art. Sameness in etch selectivity of the first supporter pattern 112 and the first insulating layer 160 with respect to the first dry etching may be caused from the first supporter pattern 112 including silicon oxycarbide (SiOC) and the first insulating layer 160 including silicon oxide ($SiO_2$).

Etch selectivity of the first supporter pattern 112 and the first mold layer 151 may be same as each other with respect to the first dry etching. That is, a first dry etching rate of the first supporter pattern 112 with respect to the first dry etching may be same as a third dry etching rate of the first mold layer 151 with respect to the first dry etching. That is, when the first dry etching is performed, the first supporter pattern 112 and the first mold layer 151 may be etched at a same speed.

Figure 8:
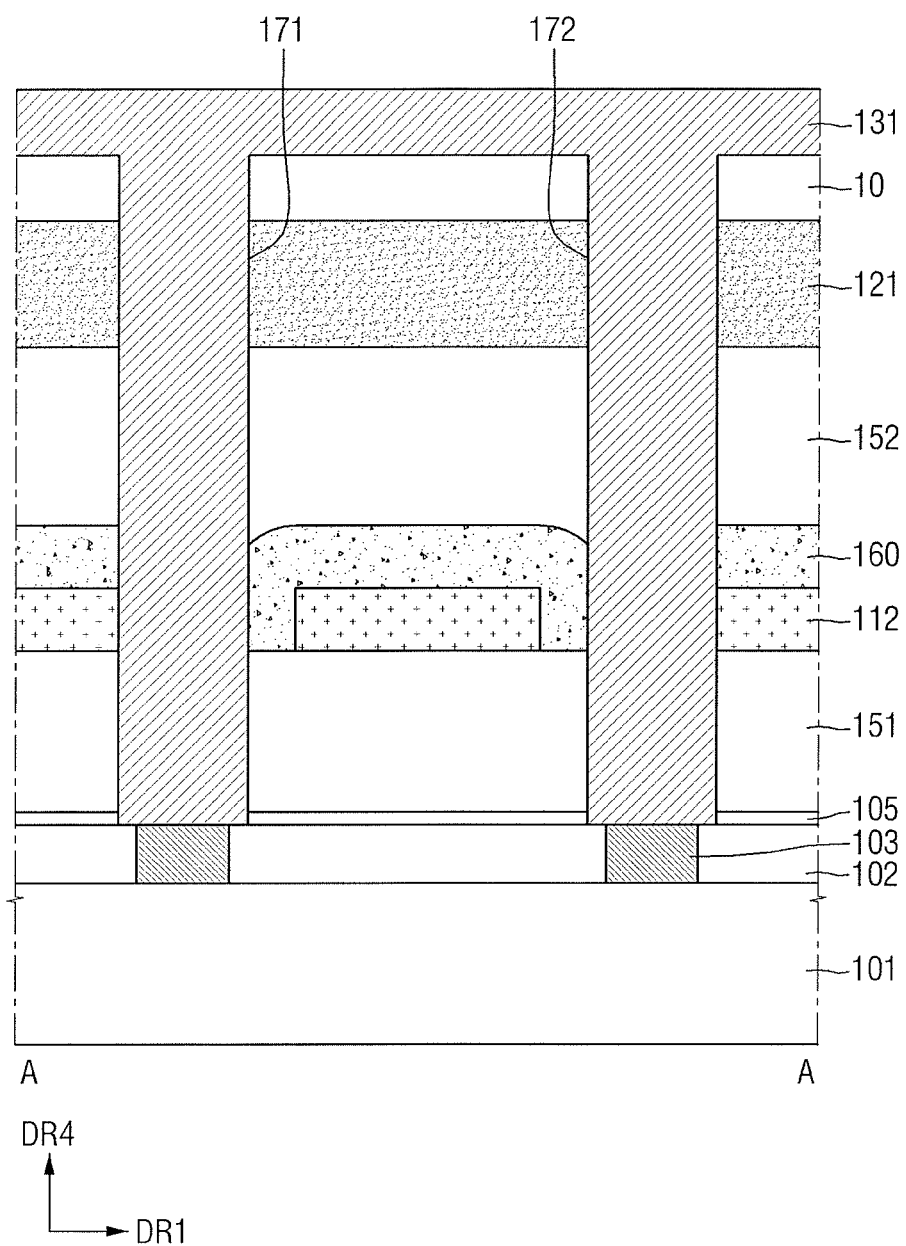

Referring to FIG. 8, a lower electrode layer 131 may be formed within each of the first contact hole 171 and the second contact hole 172 and above the first mask pattern 10. In detail, the lower electrode layer 131 may be formed to completely fill an inner portion of each of the first contact hole 171 and the second contact hole 172, and to cover a sidewall and an upper surface of the first mask pattern 10.

Figure 9:
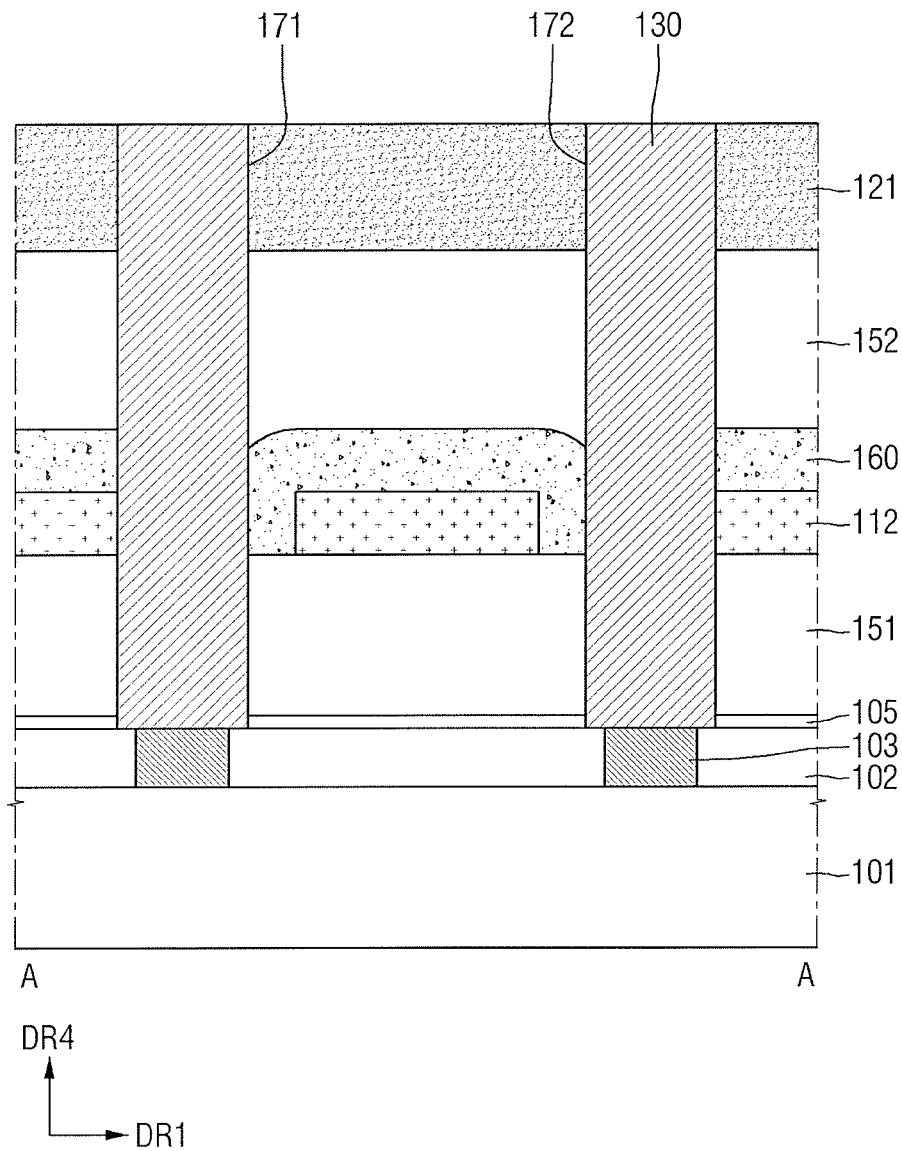

Referring to FIG. 9, a portion of the first mask pattern 10 and the lower electrode layer 131 on the second supporter layer 121 may be removed by using a process including at least one of chemical mechanical polishing and an etch back, until the second supporter layer 121 is exposed. Through the above process, the lower electrode 130 electrically connected with the contact plug 103 may be formed within each of the first contact hole 171 and the second contact hole 172.

Figure 10:
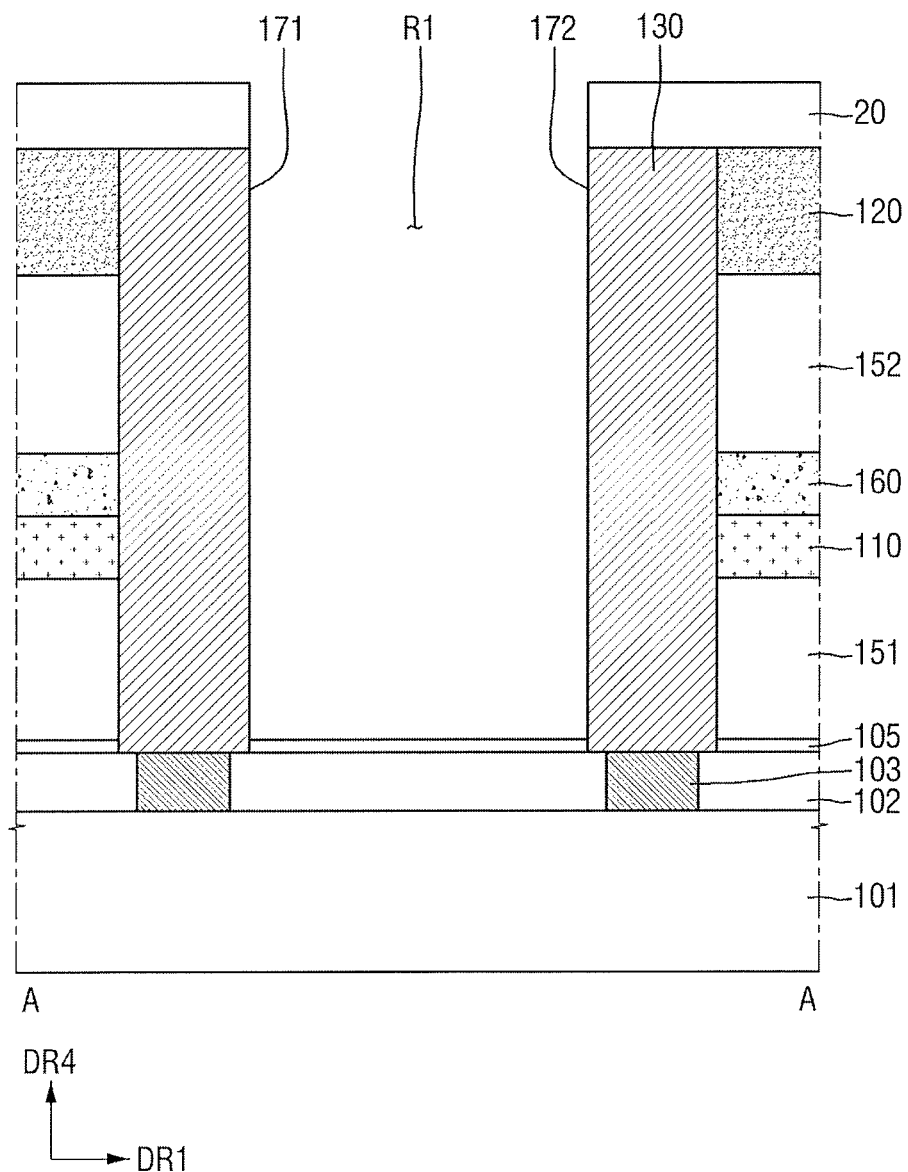

Referring to FIG. 10, a second mask pattern 20 may be formed on a portion of the second supporter layer 121 and the lower electrode 130. In detail, the second mask pattern 20 may be formed on the second supporter layer 121 and the lower electrode 260 excluding the second supporter layer 121 disposed on a region between the first contact hole 171 and the second contact hole 172, i.e., a region corresponding to the open region R1 illustrated in FIG. 1.

Subsequently, the second supporter layer 121, the second mold layer 152, the first insulating layer 160, the first supporter pattern 112, and the first mold layer 151 may be etched by using the second mask pattern 20 as a mask. Through the above process, the first supporter 110 and the second supporter 120 may be formed. That is, remaining portions of the first supporter pattern 112 and the second supporter layer 121 may be the first and second supporters 110 and 120, respectively. For example, the open region R1 may be formed by using the dry etching process.

Figure 11:
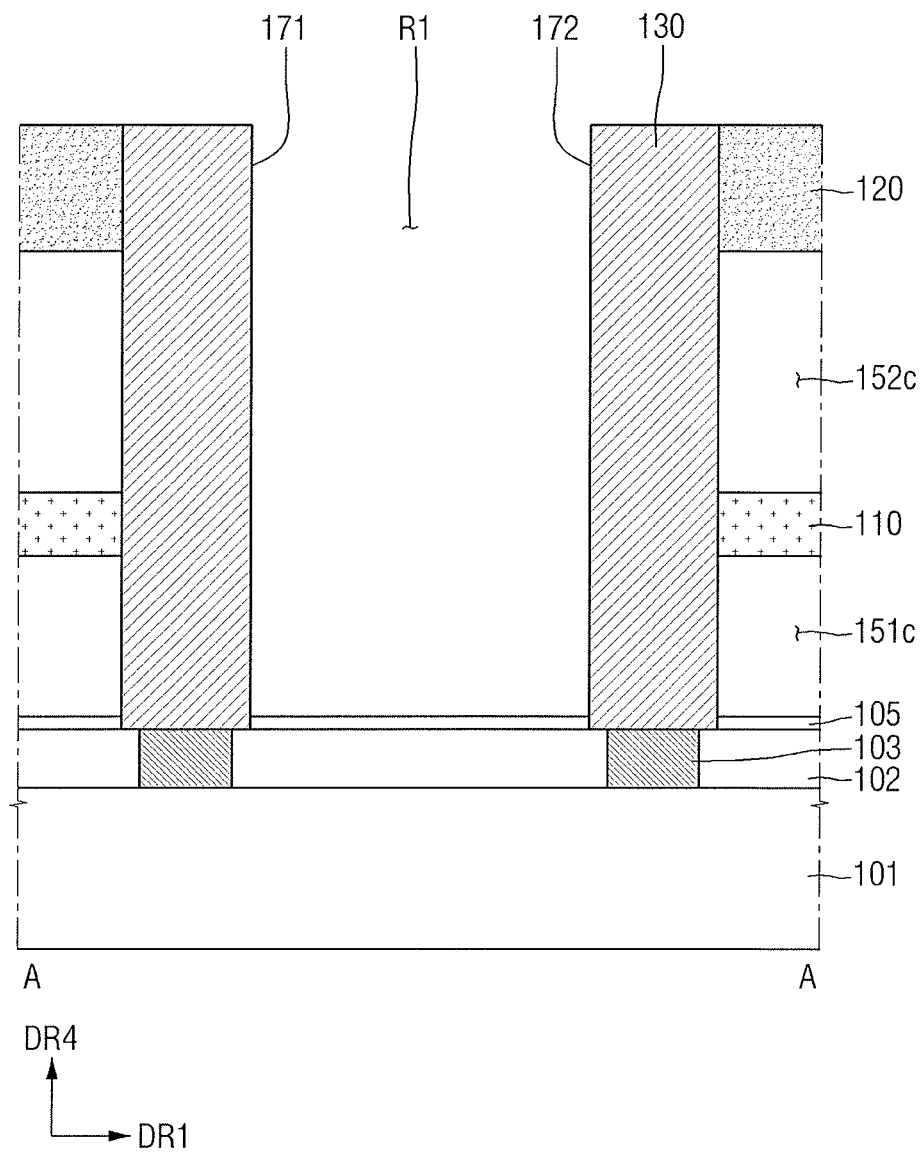

Referring to FIG. 11, the first mold layer 151, the second mold layer 152, and the first insulating layer 160 may be removed through a wet etching process after the second mask pattern is removed. That is, through the wet etching process, a first cavity 151c may be formed in a region from which the first mold layer 151 had been removed, and a second cavity 152c may be formed in a region from which the second mold layer 152 had been removed. Accordingly, as illustrated in FIG. 11, the lower electrode 130 may be supported only by the first and second supporters 110 and 120.

With respect to the above wet etching, etch selectivity of the first mold layer 151, the second mold layer 152, and the first insulating layer 160 may be same as one another. That is, a first wet etching rate of the first insulating layer 160 with respect to the wet etching may be same as a second wet etching rate of the first mold layer 151 with respect to the wet etching and a third wet etching rate of the second mold layer 152.

Referring to FIG. 2, the capacitor dielectric layer 135 may be conformally formed on the lower electrode 130, the first supporter 110, the second supporter 120, and the etch stop layer 105. In detail, the capacitor dielectric layer 135 may be formed along a sidewall and an upper surface of the lower electrode 130. The capacitor dielectric layer 135 may be formed along an upper surface and a lower surface of the first supporter 110. The capacitor dielectric layer 135 may be formed along an upper surface and a lower surface of the second supporter 120. The capacitor dielectric layer 135 may be formed along an upper surface of the etch stop layer 105.

Subsequently, the upper electrode 140 may be formed on the capacitor dielectric layer 135. In detail, the upper electrode 140 may be formed between the adjacent lower electrodes 130, between the first supporter 110 and the second supporter 120, and between the first supporter 110 and the etch stop layer 105. Through the above-described fabrication process, the semiconductor device illustrated in FIG. 2 may be fabricated.

The method for fabricating a semiconductor device according to some exemplary embodiments may prevent void formation between the lower supporter pattern 112 by forming the first insulating layer 160 so as to cover the lower supporter pattern 112 before forming the second mold layer 152. In other words, as the first insulating layer 160 is formed between portions of the lower supporter pattern 112 to completely fill spaces therebetween without voids, the second mold layer 152 may be formed, subsequently, on the lower supporter pattern 112, which is completely covered by the insulating layer 160, without voids.

Further, the method for fabricating a semiconductor device according to some exemplary embodiments may prevent a tilt phenomenon of a profile of a sidewall in the contact hole 170, as the first insulating layer 160 has no difference of etch selectivity with respect to the lower supporter pattern 112. That is, a potential tilt caused by a difference of etch selectivity of different layers etched during formation of a contact hole therethrough may be prevented, as the first insulating layer 160 has no difference of etch selectivity with respect to the lower supporter pattern 112, thereby being etched at a same rate to have a substantially flat and uniform sidewall profile.

Hereinafter, with reference to FIG. 12 and FIG. 13, a semiconductor device fabricated by a method for fabricating a semiconductor device according to some other exemplary embodiments will be described. The difference from the semiconductor device illustrated in FIG. 1 and FIG. 2 will be highlighted.

Figure 12:
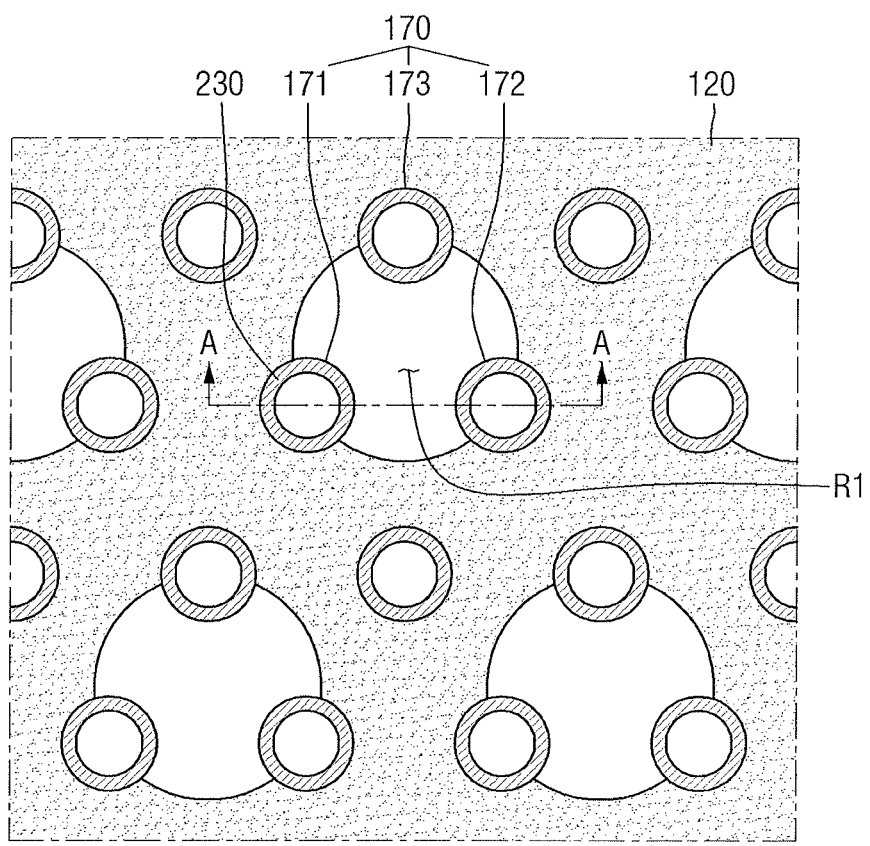
FIG. 12 illustrates a plan view of a semiconductor device fabricated by a method for fabricating a semiconductor device according to other exemplary embodiments.

FIG. 12 is a view provided to explain a semiconductor device fabricated by a method for fabricating a semiconductor device according to some other exemplary embodiments. FIG. 13 is a cross-sectional view taken along line A-A of FIG. 12.

Figure 13:
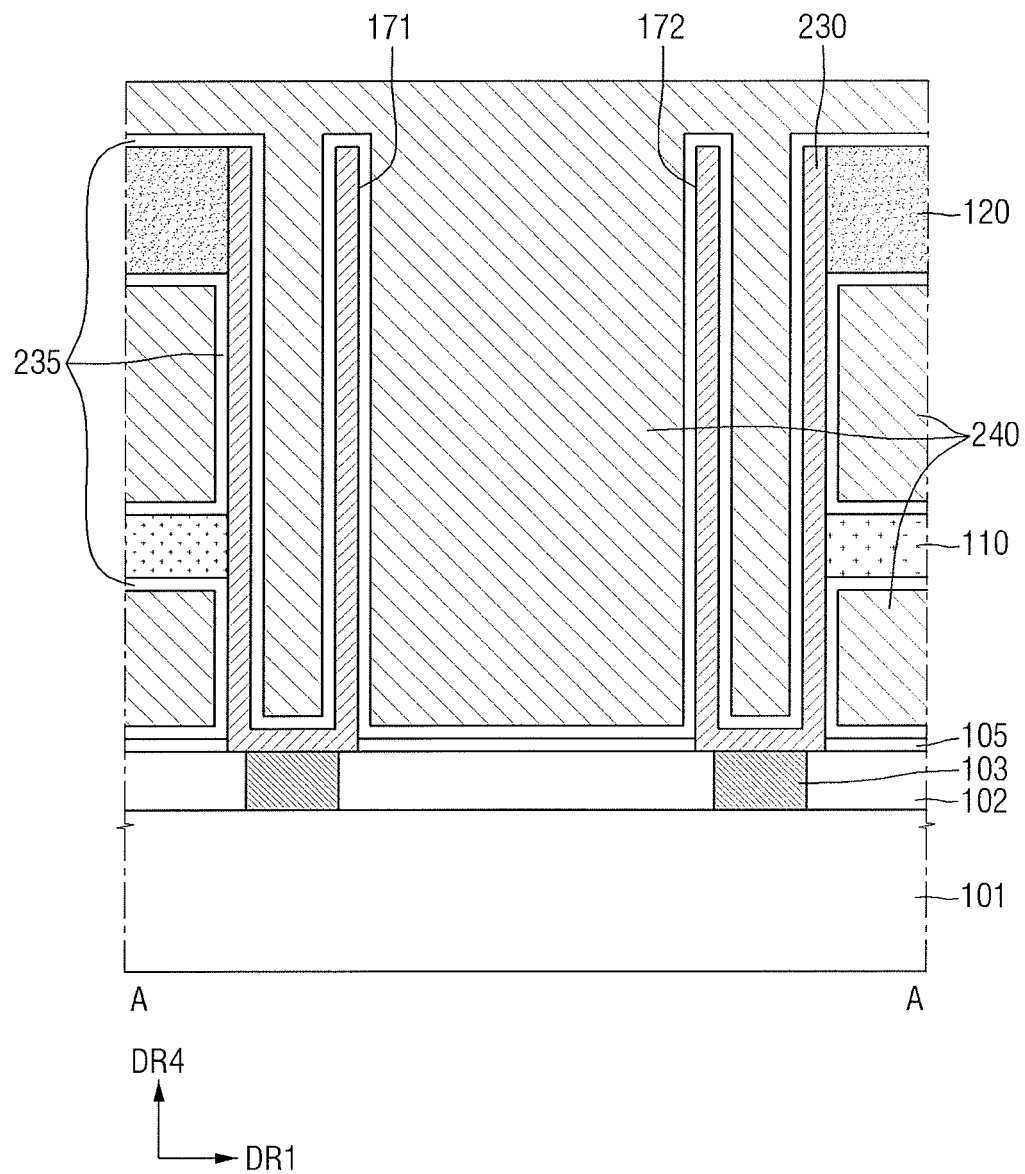
FIG. 13 illustrates a cross-sectional view along line A-A of FIG. 12.

Referring to FIG. 12 and FIG. 13, in the semiconductor device fabricated by a method for fabricating a semiconductor device according to some other exemplary embodiments, a lower electrode 230 may have a cylinder shape, e.g., with a U-Shaped cross-section. In detail, the lower electrode 230 may be disposed, e.g., conformally, along a sidewall and a bottom surface of the first contact hole 171 and the second contact hole 172.

A capacitor dielectric layer 235 may be conformally disposed on the lower electrode 230, the first supporter 110, the second supporter 120, and the etch stop layer 105. The capacitor dielectric layer 235 may be entirely formed on an outer wall and an inner wall of the lower electrode 230.

An upper electrode 240 may be disposed on the capacitor dielectric layer 235. In detail, the upper electrode 240 may be disposed within the lower electrode 230 having a cylinder shape, between the adjacent lower electrodes 230, between the first supporter 110 and the second supporter 120, and between the first supporter 110 and the etch stop layer 105.

Hereinbelow, a method for fabricating a semiconductor device according to some other exemplary embodiments will be described with reference to FIG. 14 and FIG. 15. The difference from the method for fabricating a semiconductor device illustrated in FIG. 3 to FIG. 11 will be highlighted.

Figure 14:
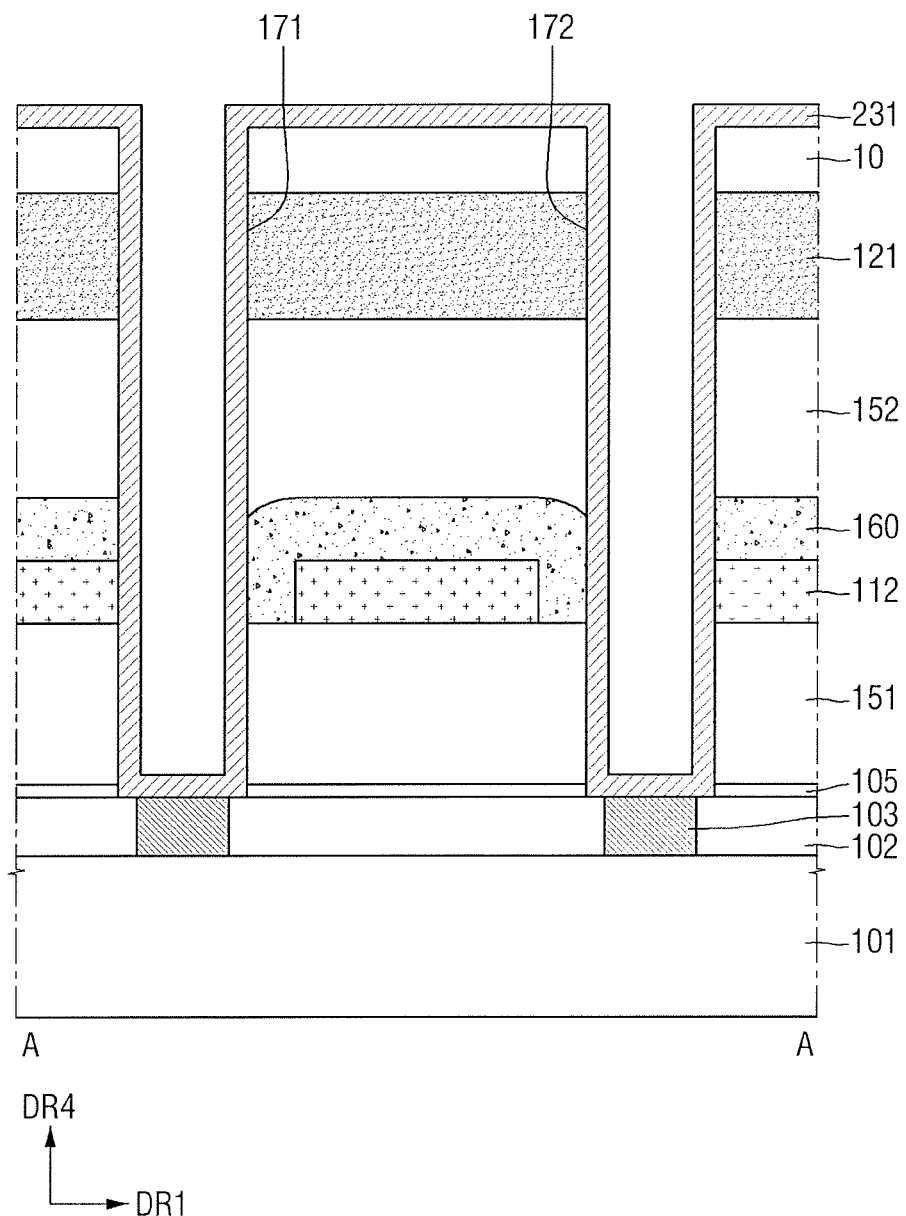
FIG. 14 and FIG. 15 illustrate cross-sectional views of stages in the method for fabricating the semiconductor device in FIG. 13 according to embodiments.
Figure 15:
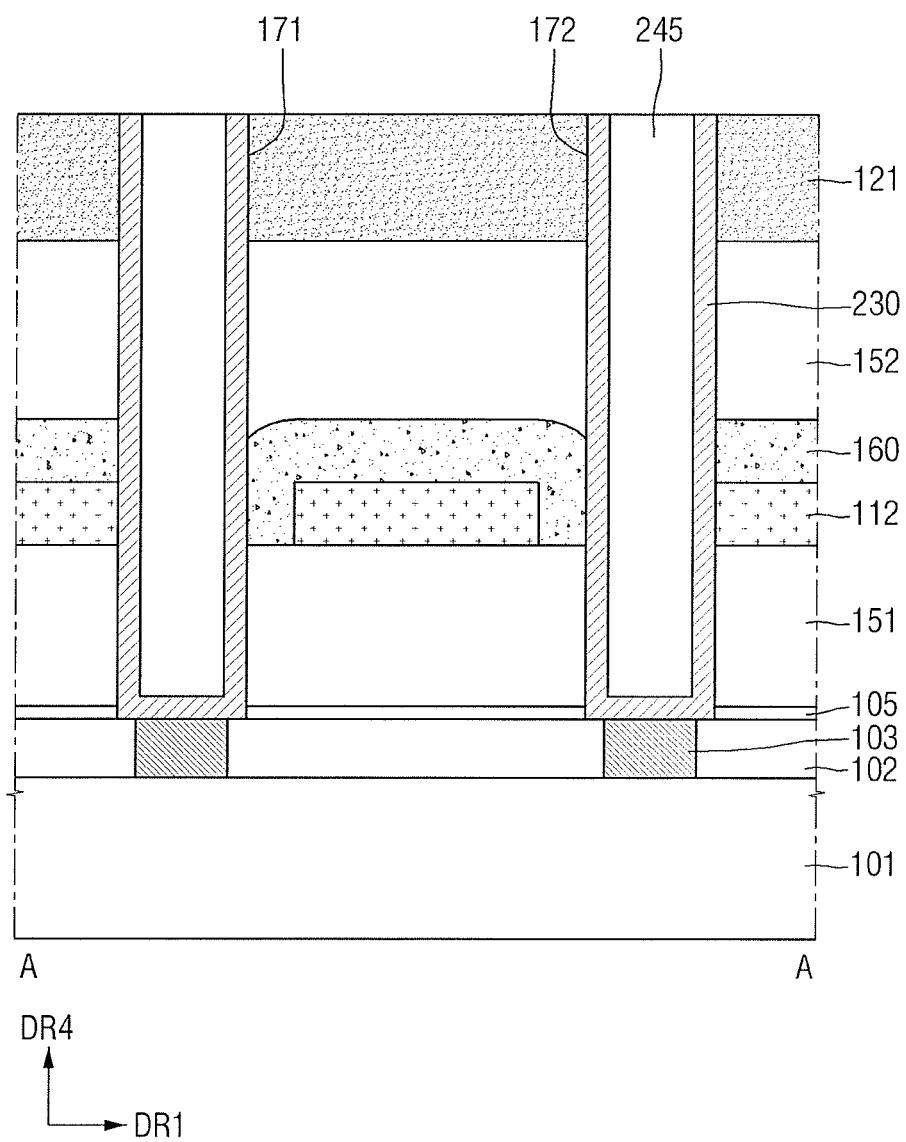

FIG. 14 and FIG. 15 are views illustrating intermediate stages of fabrication, provided to explain the method for fabricating a semiconductor device illustrated in FIG. 13 according to some other exemplary embodiments.

Referring to FIG. 14, a lower electrode layer 231 may be formed within each of the first contact hole 171 and the second contact hole 172 and above the first mask pattern 10, after the processes described in FIG. 3 to FIG. 7 are performed. In detail, the lower electrode layer 231 may be conformally formed to cover a sidewall and a bottom surface of an inner portion of each of the first contact hole 171 and the second contact hole 172 and a sidewall and an upper surface of the first mask pattern 10.

Referring to FIG. 15, a sacrificial layer 245 may be formed to fill an inner portion of each of the first contact hole 171 and the second contact hole 172 on the lower electrode layer 231. Subsequently, at least a portion of the first mask pattern 10, the sacrificial layer 245, and the lower electrode layer 231 on the second supporter layer 121 may be removed by using a process including at least one of chemical mechanical polishing (CMP) and an etch back, until the second supporter layer 121 is exposed.

Through the above process, the lower electrode 230 electrically connected with the contact plug 103 and having a cylinder shape may be formed within each of the first contact hole 171 and the second contact hole 172. Subsequently, after the processes described in FIG. 10 and FIG. 11 are performed, the semiconductor device illustrated in FIG. 13 may be fabricated by removing the sacrificial layer 245 and forming the upper electrode 240 on the capacitor dielectric layer 135.

Hereinbelow, a method for fabricating a semiconductor device according to some other exemplary embodiments will be described with reference to FIG. 16 and FIG. 17. The difference from the method for fabricating a semiconductor device illustrated in FIG. 3 to FIG. 11 will be highlighted.

Figure 16:
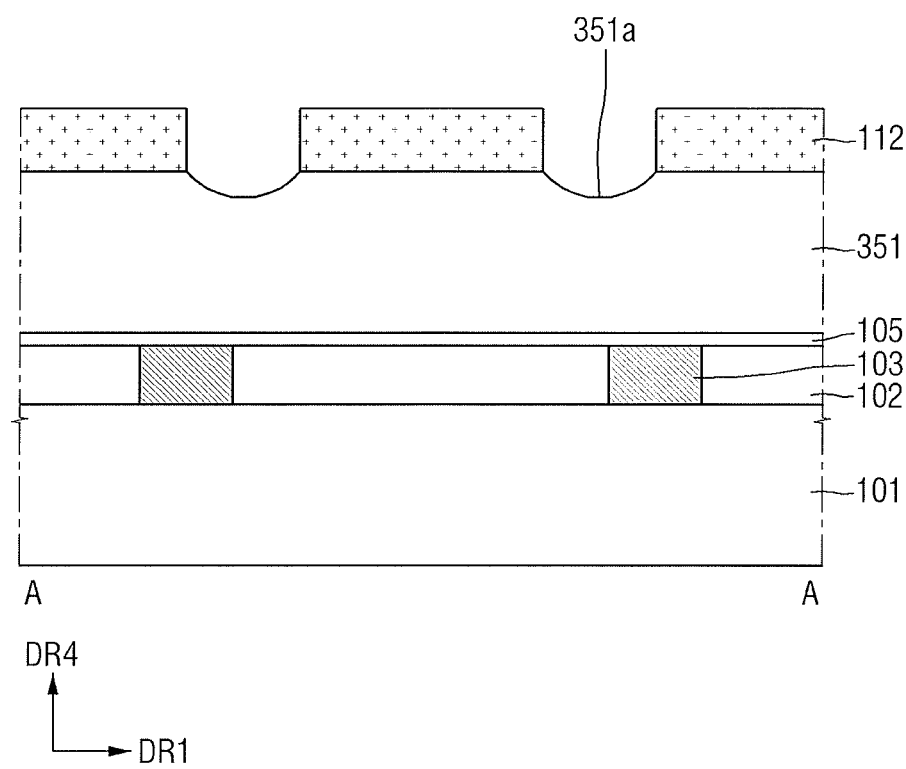
FIG. 16 and FIG. 17 illustrate cross-sectional views of stages in a method for fabricating a semiconductor device according to some other exemplary embodiments.
Figure 17:
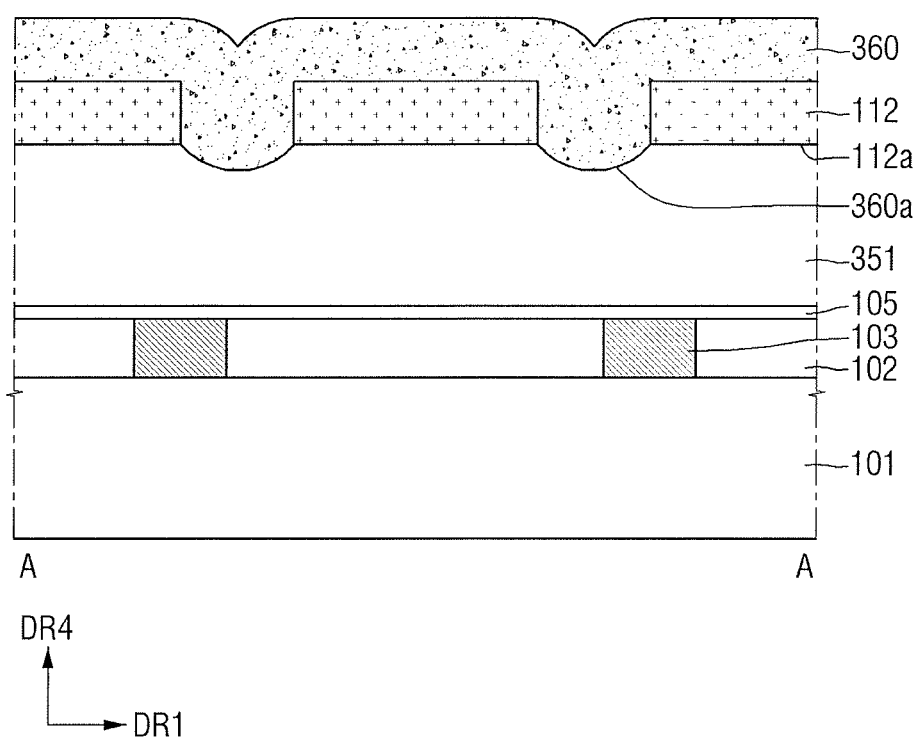

FIG. 16 and FIG. 17 are views illustrating intermediate stages of fabrication, provided to explain a method for fabricating a semiconductor device according to some other exemplary embodiments.

Referring to FIG. 16, the first supporter pattern 112 may be formed by etching the first supporter layer 111 of FIG. 3 so as to expose at least a portion of an upper surface 351a of the first mold layer 351, after the processes described in FIG. 3 are performed. The exposed upper surface 351a of the first mold layer 351 may be formed to be indented within the first mold layer 351.

Referring to FIG. 17, an insulating layer 360 may be formed so as to cover the exposed upper surface 351a of the first mold layer 351 and the first supporter pattern 112. A lower surface 360a of the insulating layer 360 formed between the first supporter pattern 112 may be formed closer to the substrate 101 than a lower surface 112a of the first supporter pattern 112. Subsequently, the semiconductor device illustrated in FIG. 2 may be fabricated by performing the processes described in FIG. 6 to FIG. 11.

Hereinbelow, a method for fabricating a semiconductor device according to some other exemplary embodiments will be described with reference to FIG. 18 and FIG. 19. The difference from the method for fabricating a semiconductor device illustrated in FIG. 3 to FIG. 11 will be highlighted.

Figure 18:
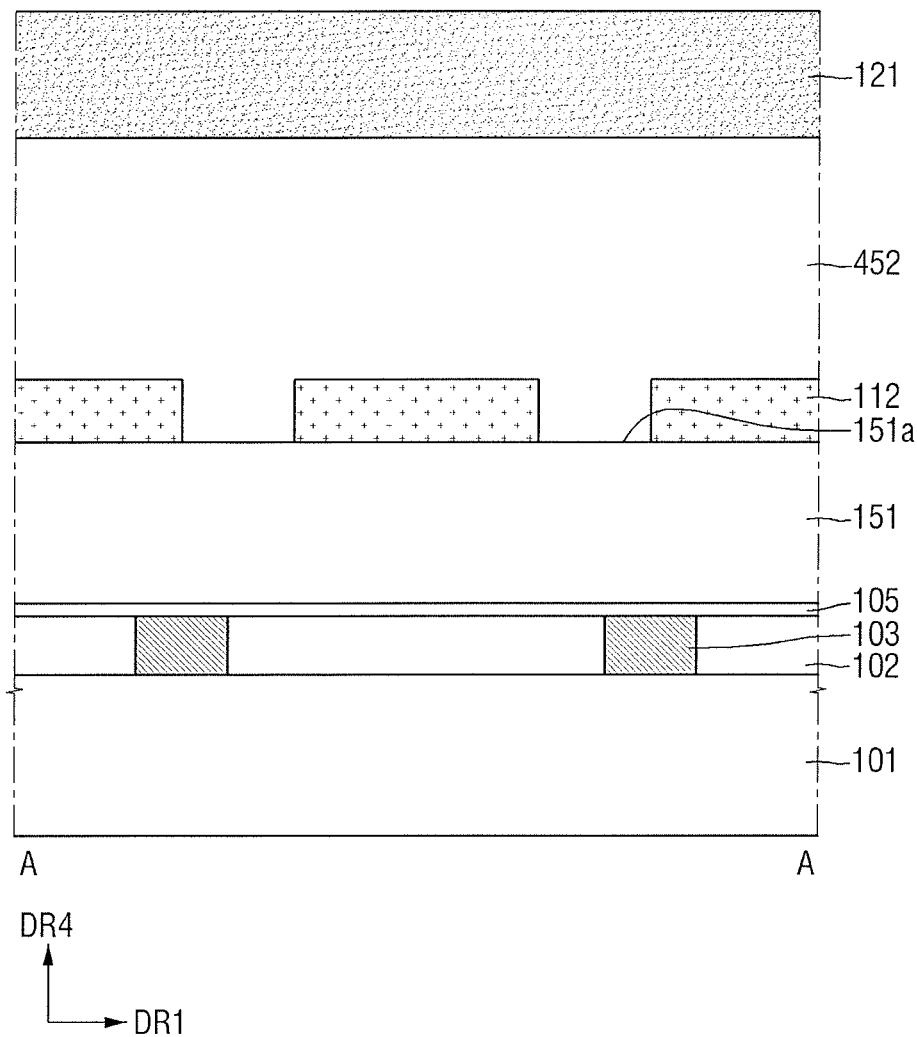
FIG. 18 and FIG. 19 illustrate cross-sectional views of stages in a method for fabricating a semiconductor device according to some other exemplary embodiments.
Figure 19:
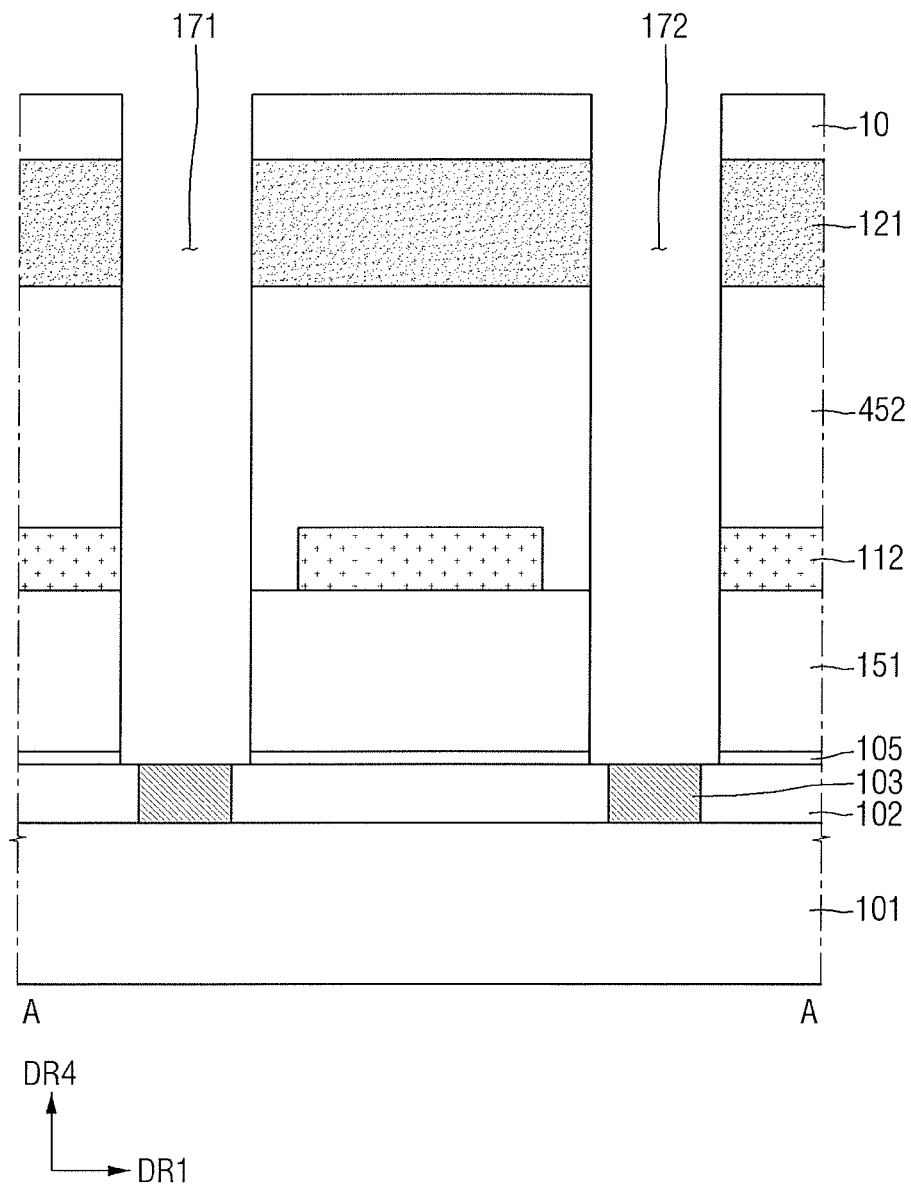

FIG. 18 and FIG. 19 are views illustrating intermediate stages of fabrication, provided to explain a method for fabricating a semiconductor device according to some other exemplary embodiments.

Referring to FIG. 18, a second mold layer 452 and a second supporter layer 121 may be sequentially stacked on the exposed first mold layer 151 and the first supporter pattern 112 after the processes described in FIG. 3 and FIG. 4 are performed. The second mold layer 152 may be formed by using, e.g., a chemical vapor deposition process. However, the present disclosure is not limited thereto.

Referring to FIG. 19, the first contact hole 171 and the second contact hole 172 may be formed by etching the second supporter layer 121, the second mold layer 452, at least a portion of the first supporter pattern 112, the first mold layer 151 and the etch stop layer 105 in utilization of the first mask pattern 10 formed on the second supporter layer 121 as a mask. Subsequently, the semiconductor device illustrated in FIG. 2 may be fabricated by performing the processes described in FIG. 8 to FIG. 11.

Hereinafter, with reference to FIG. 20, a semiconductor device fabricated by a method for fabricating a semiconductor device according to some other exemplary embodiments will be described. The difference from the semiconductor device illustrated in FIG. 2 will be highlighted.

Figure 20:
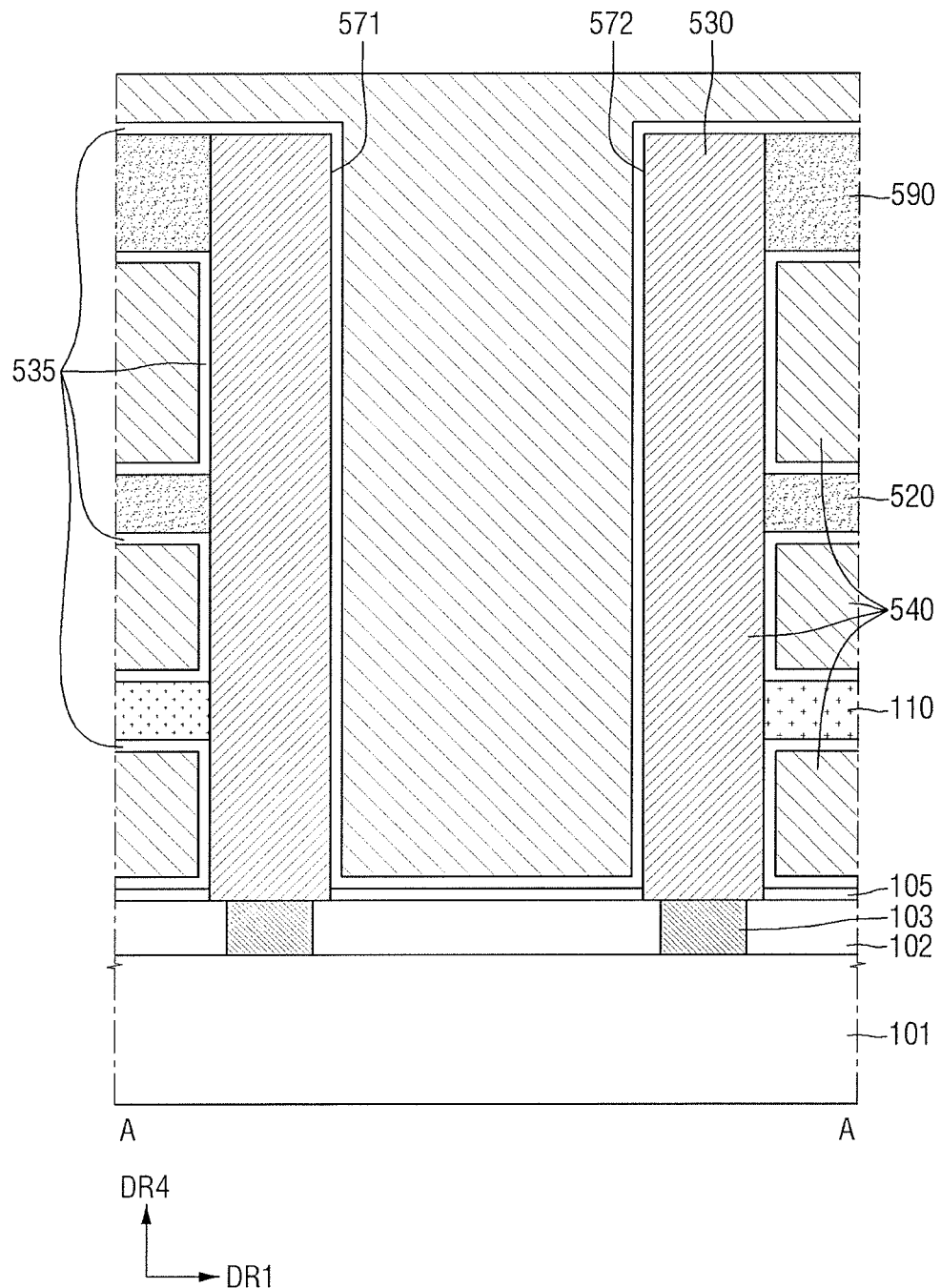
FIG. 20 illustrates a cross-sectional view of a semiconductor device fabricated by a method for fabricating a semiconductor device according to some other exemplary embodiments.

FIG. 20 is a cross-sectional view provided to explain a semiconductor device fabricated by a method for fabricating a semiconductor device according to some other exemplary embodiments.

Referring to FIG. 20, the semiconductor device fabricated by a method for fabricating a semiconductor device according to some other exemplary embodiments may include the first supporter 110 as a lower supporter, the second supporter 520 as a middle supporter, and a third supporter 590 as an upper supporter. In detail, the second supporter 520 may be disposed as being spaced apart in the fourth direction DR4 on the first supporter 110, and the third supporter 590 may be disposed on the second supporter 520 as being spaced apart in the fourth direction DR4. Thickness in the fourth direction DR4 of the third supporter 590 may be formed to be greater than thickness in the fourth direction DR4 of the first supporter 110 and thickness in the fourth direction DR4 of the second supporter 520. However, the present disclosure is not limited thereto.

Each of the first to third supporters 110, 520, 590 may be disposed to be in contact with sidewalls of the first and second contact holes 571, 572. An upper surface of the third supporter 590 may be formed on a same plane as an upper surface of the lower electrode 530. However, the present disclosure is not limited thereto.

The capacitor dielectric layer 535 may be conformally disposed on the lower electrode 530, the first supporter 110, the second supporter 520, the third supporter 590 and the etch stop layer 105. The upper electrode 540 may be disposed on the capacitor dielectric layer 535. In detail, the upper electrode 540 may be disposed between the adjacent lower electrodes 530, between the first supporter 110 and the second supporter 520, between the second supporter 520 and the third supporter 590, and between the first supporter 110 and the etch stop layer 105.

Hereinbelow, a method for fabricating a semiconductor device according to some other exemplary embodiments will be described with reference to FIG. 21 and FIG. 22. The difference from the method for fabricating a semiconductor device illustrated in FIG. 3 to FIG. 11 will be highlighted.

Figure 21:
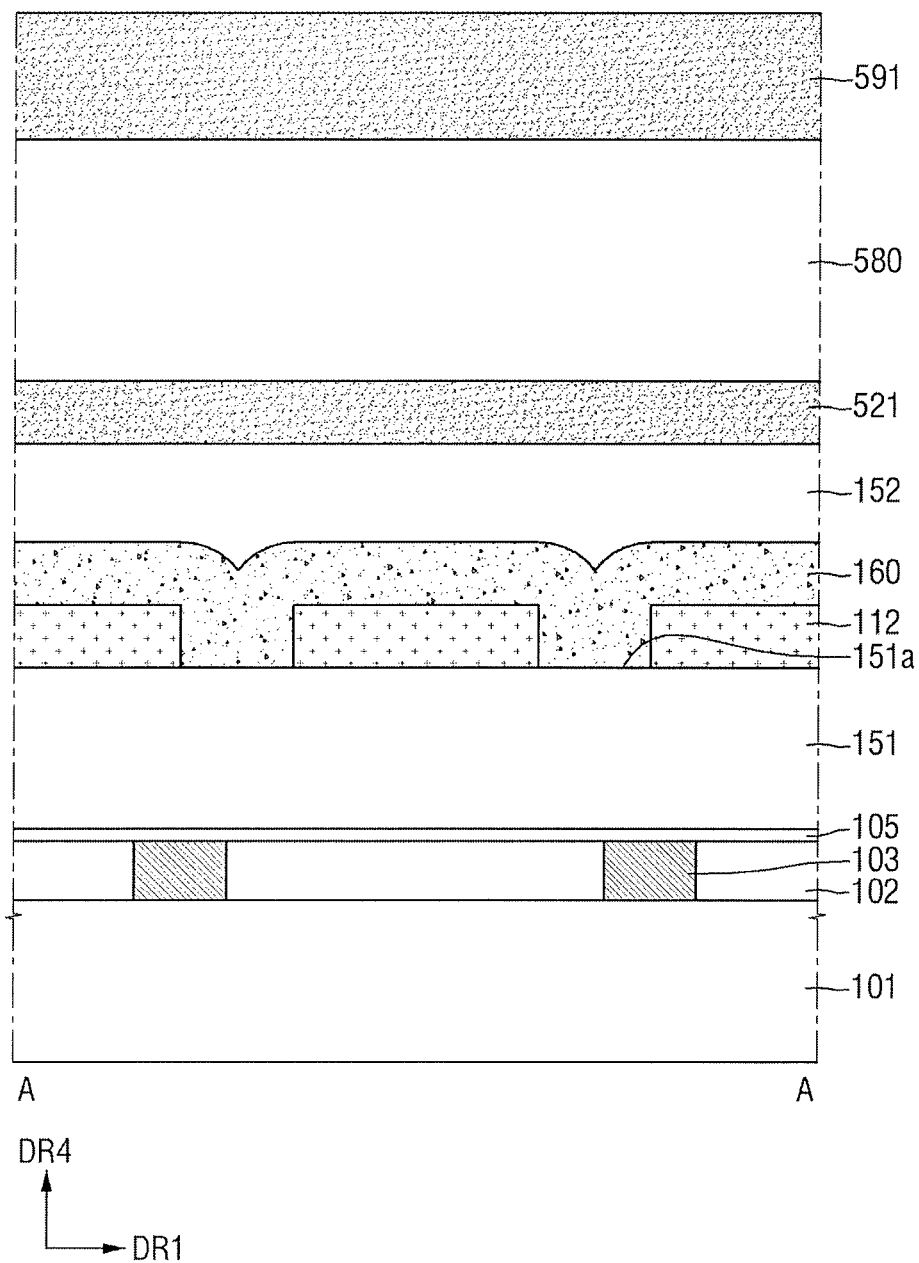
FIG. 21 and FIG. 22 illustrate cross-sectional views of stages in a method for fabricating the semiconductor device in FIG. 20 according to embodiments.
Figure 22:
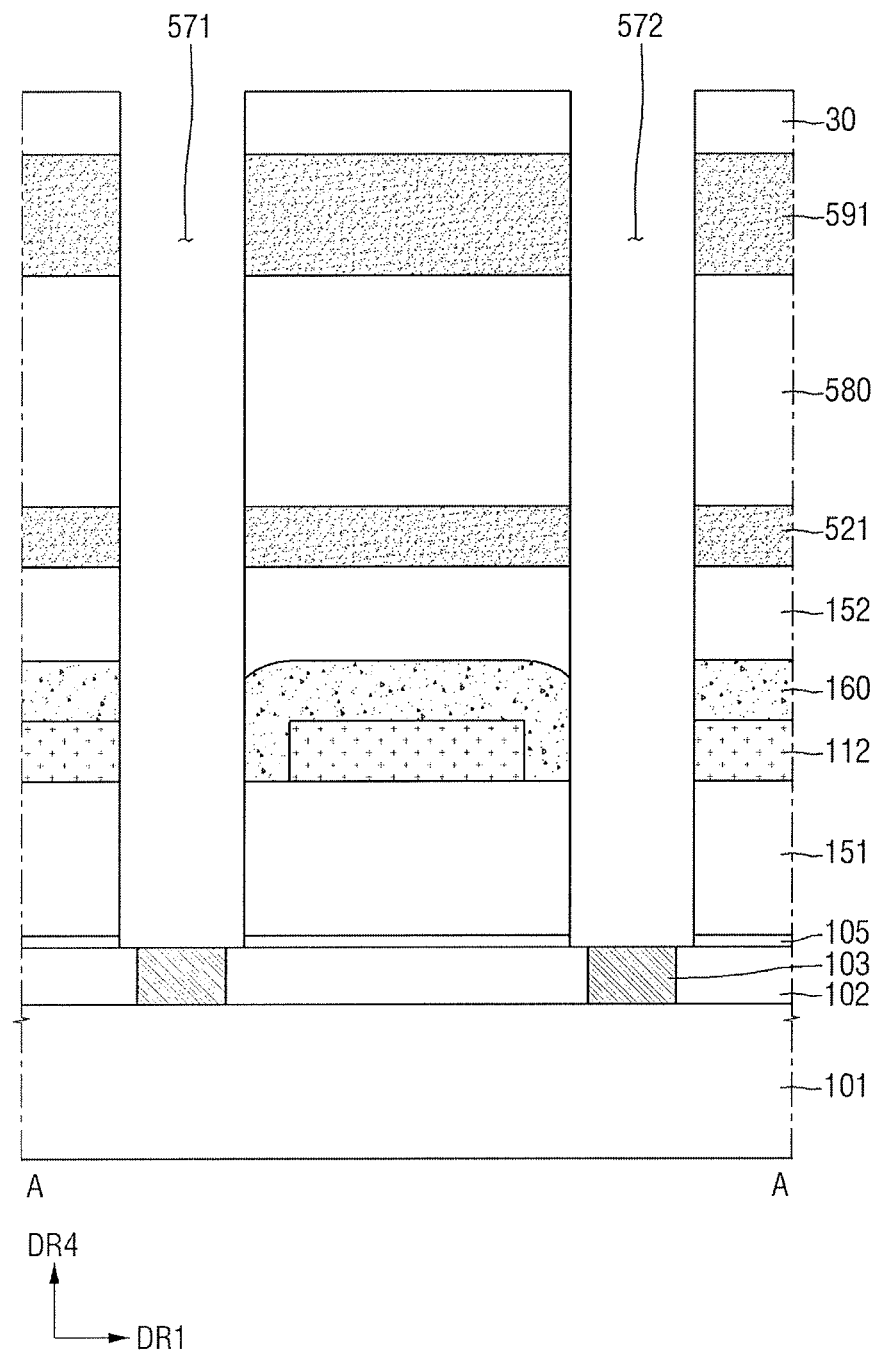

FIG. 21 and FIG. 22 are views illustrating intermediate stages of fabrication, provided to explain the method for fabricating a semiconductor device illustrated in FIG. 20 according to some other exemplary embodiments.

Referring to FIG. 21, the second mold layer 152, the second supporter layer 521, the third mold layer 580, and the third supporter layer 591 may be sequentially stacked on the first insulating layer 160, after the processes described in FIG. 3 to FIG. 5 are performed. Each of the second supporter layer 521 and the third supporter layer 591 may include, e.g., at least one of silicon oxynitride (SiON), silicon nitride (SiN), silicon carbon nitride (SiCN), and tantalum oxide (TaO). The third mold layer 580 may include a same material as that of the second mold layer 152 and the first insulating layer 160, e.g., silicon oxide (SiO$_2$).

Referring to FIG. 22, the first contact hole 571 and the second contact hole 572 may be formed by etching the third supporter layer 591, the third mold layer 580, the second supporter layer 521, the second mold layer 152, the first insulating layer 160, at least a portion of the first supporter pattern 112, the first mold layer 151 and the etch stop layer 105 in utilization of a third mask pattern 30 formed on the third supporter layer 591 as a mask. Subsequently, the semiconductor device illustrated in FIG. 20 may be fabricated by going through a process of additionally removing the third mold layer 580 in the process described in FIG. 11, after the processes described in FIG. 8 and FIG. 9 are performed.

Hereinafter, with reference to FIG. 23, a semiconductor device fabricated by a method for fabricating a semiconductor device according to some other exemplary embodiments will be described. The difference from the semiconductor device illustrated in FIG. 2 will be highlighted.

Figure 23:
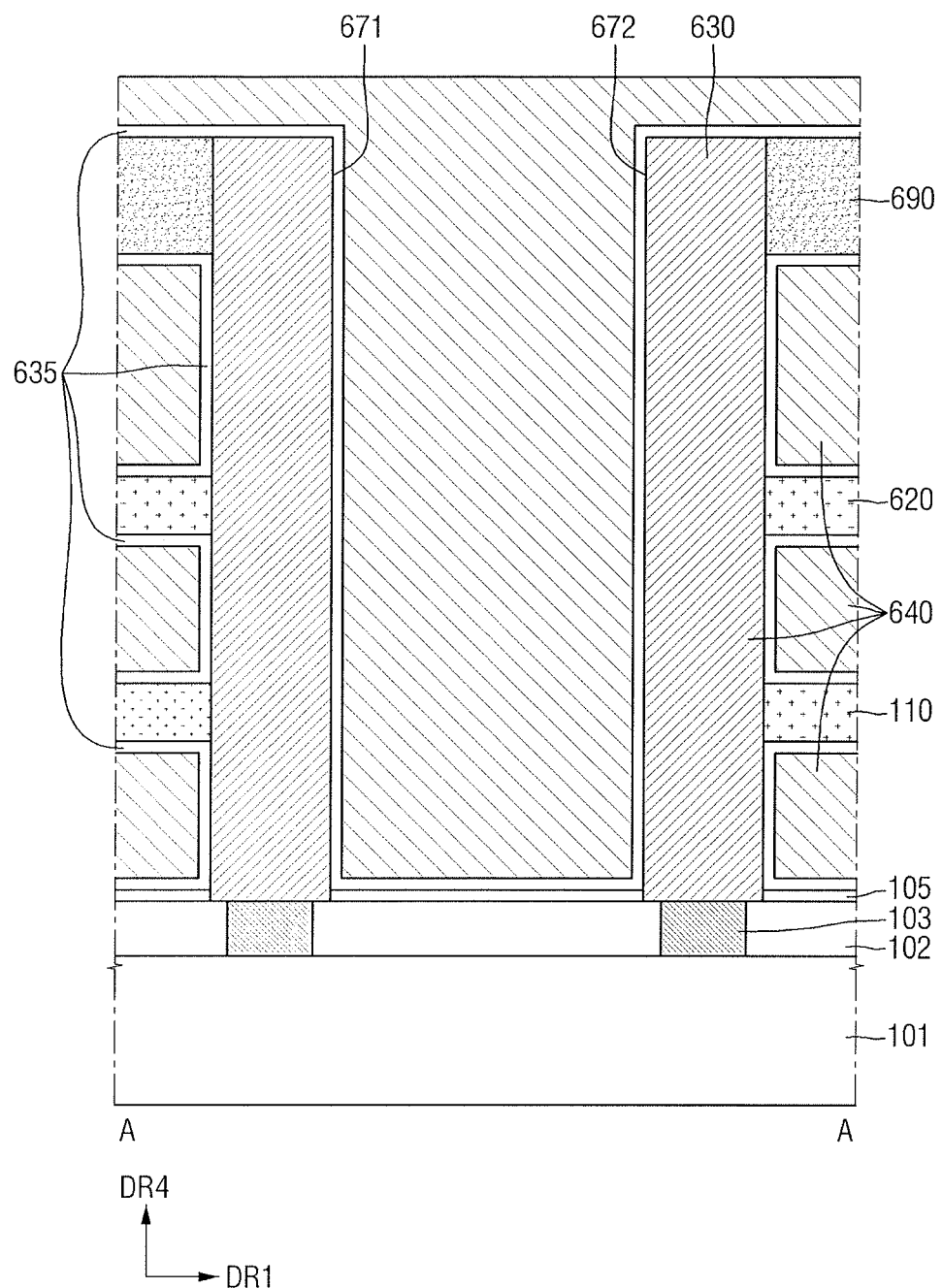
FIG. 23 illustrates a cross-sectional view of a semiconductor device fabricated by a method for fabricating a semiconductor device according to some other exemplary embodiments.

FIG. 23 is a cross-sectional view provided to explain a semiconductor device fabricated by a method for fabricating a semiconductor device according to some other exemplary embodiments.

Referring to FIG. 23, the semiconductor device fabricated by a method for fabricating a semiconductor device according to some other exemplary embodiments may include the first supporter 110 as a lower supporter, the second supporter 620 as a middle supporter, and a third supporter 690 as an upper supporter. In detail, the second supporter 620 may be disposed as being spaced apart in the fourth direction DR4 on the first supporter 110, and the third supporter 690 may be disposed on the second supporter 620 as being spaced apart in the fourth direction DR4. Thickness in the fourth direction DR4 of the third supporter 690 may be formed to be greater than thickness in the fourth direction DR4 of the first supporter 110 and thickness in the fourth direction DR4 of the second supporter 620. However, the present disclosure is not limited thereto.

Each of the first to third supporters 110, 620, 690 may be disposed to be in contact with sidewalls of the first and second contact holes 671, 672. An upper surface of the third supporter 690 may be formed on a same plane as an upper surface of the lower electrode 630. However, the present disclosure is not limited thereto.

The first supporter 110 and the second supporter 620 may include, e.g., silicon oxycarbide (SiOC). The capacitor dielectric layer 635 may be conformally disposed on the lower electrode 630, the first supporter 110, the second supporter 620, the third supporter 690 and the etch stop layer 105.

The upper electrode 640 may be disposed on the capacitor dielectric layer 635. In detail, the upper electrode 640 may be disposed between the adjacent lower electrodes 630, between the first supporter 110 and the second supporter 620, between the second supporter 620 and the third supporter 690, and between the first supporter 110 and the etch stop layer 105.

Figure 24:
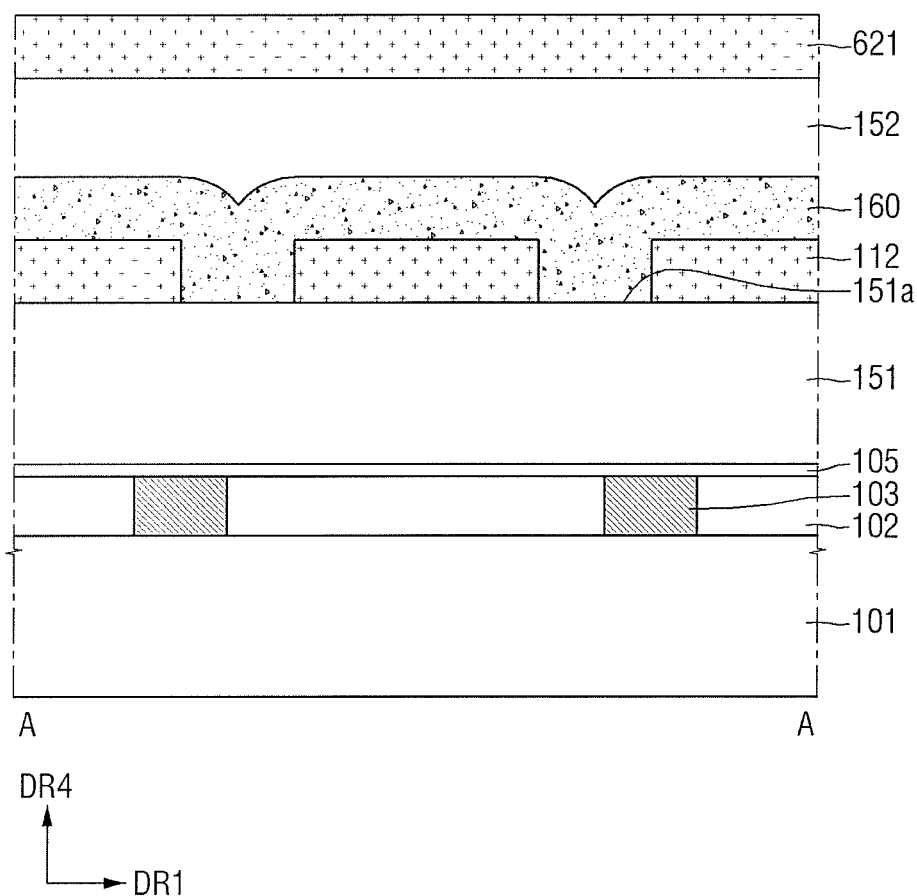
FIG. 24 to FIG. 27 illustrate cross-sectional views of stages in a method for fabricating the semiconductor device illustrated in FIG. 23 according to embodiments.

Referring to FIG. 24, the second mold layer 152 and the second supporter layer 621 may be sequentially stacked on the first insulating layer 160, after the processes described in FIG. 3 to FIG. 5 are performed. The second supporter layer 621 may include, e.g., silicon oxycarbide (SiOC).

Figure 25:
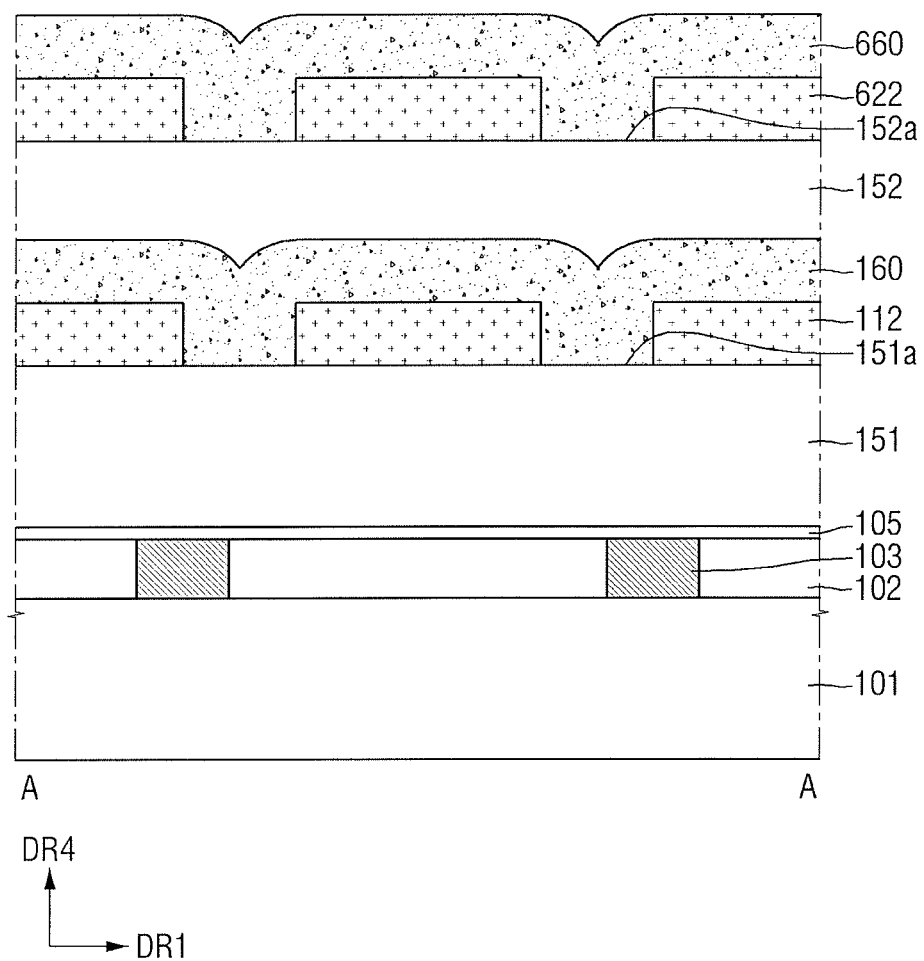

Referring to FIG. 25, the second supporter pattern 622 may be formed by etching the second supporter layer 621 of FIG. 24 so as to expose at least a portion of an upper surface 152a of the second mold layer 152. At least a portion of the exposed upper surface 152a of the second mold layer 152 may be formed to overlap the contact plug 103.

The second insulating layer 660 may be formed so as to cover the exposed upper surface 152a of the second mold layer 152 and the second supporter pattern 622. The second insulating layer 660 may be formed by, e.g., an atomic layer deposition process. Accordingly, the second insulating layer 660 may be conformally formed on the exposed upper surface 152a of the second mold layer 152 and the second supporter pattern 622.

A lower surface of the second insulating layer 660 may be formed on a same plane as a lower surface of the second supporter pattern 622. However, the present disclosure is not limited thereto.

The second insulating layer 660 may be formed to completely fill a region between the second supporter pattern 622. For example, the second insulating layer 660 may be formed by thickness, so as to completely fill a region between the second supporter pattern 622 with an atomic layer deposition process. Accordingly, void formation of a region between the second supporter pattern 622 may be efficiently prevented.

The second insulating layer 660 may include a same material as the second mold layer 152. The second insulating layer 660 may include, e.g., silicon oxide (SiO$_2$). However, the present disclosure is not limited thereto.

Figure 26:
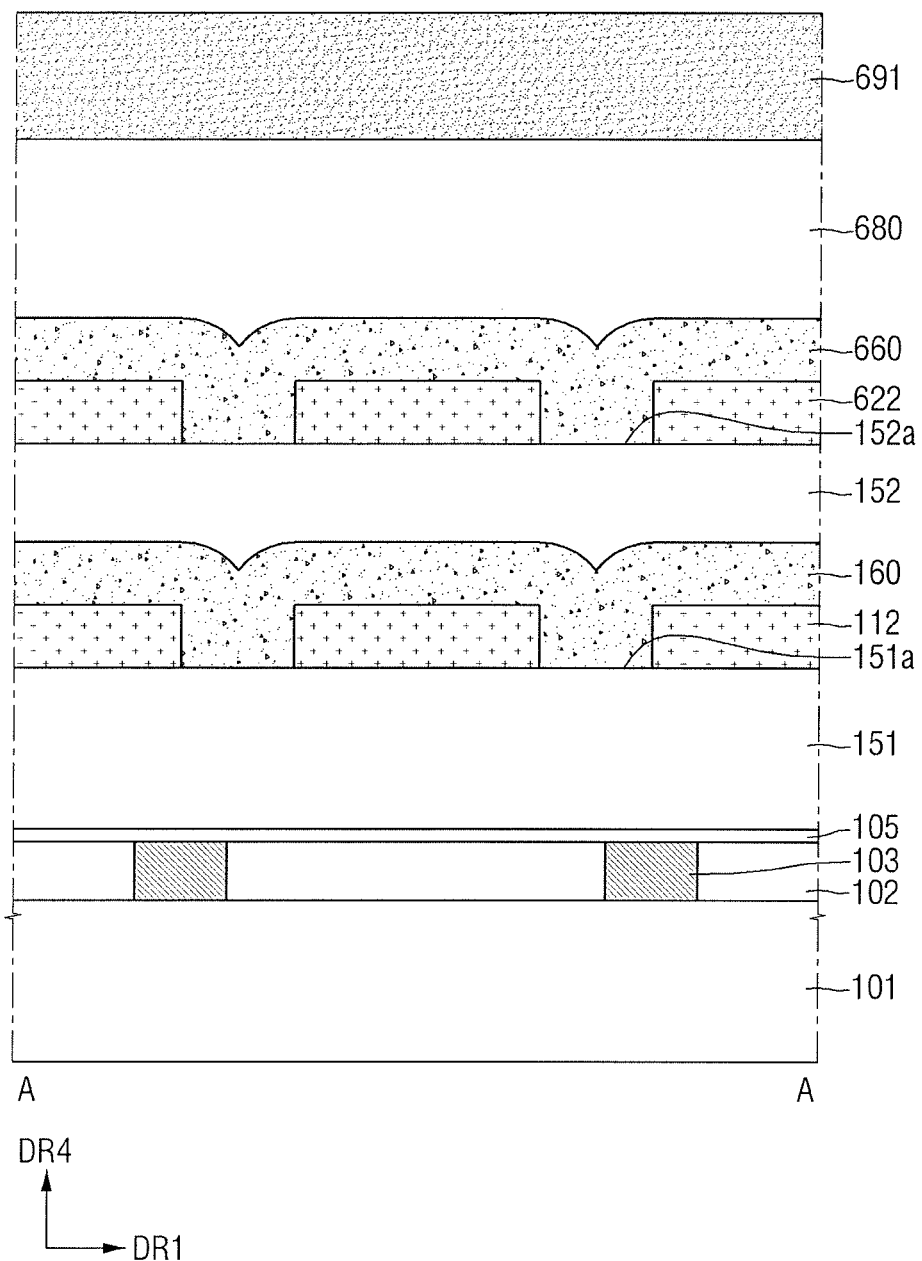

Referring to FIG. 26, a third mold layer 680 and a third supporter layer 691 may be sequentially stacked on the second insulating layer 660. The third supporter layer 691 may include, e.g., at least one of silicon oxynitride (SiON), silicon nitride (SiN), silicon carbon nitride (SiCN), and tantalum oxide (TaO). The third mold layer 680 may include a same material as that of the second mold layer 152 and the second insulating layer 660, e.g., silicon oxide (SiO$_2$).

Figure 27:
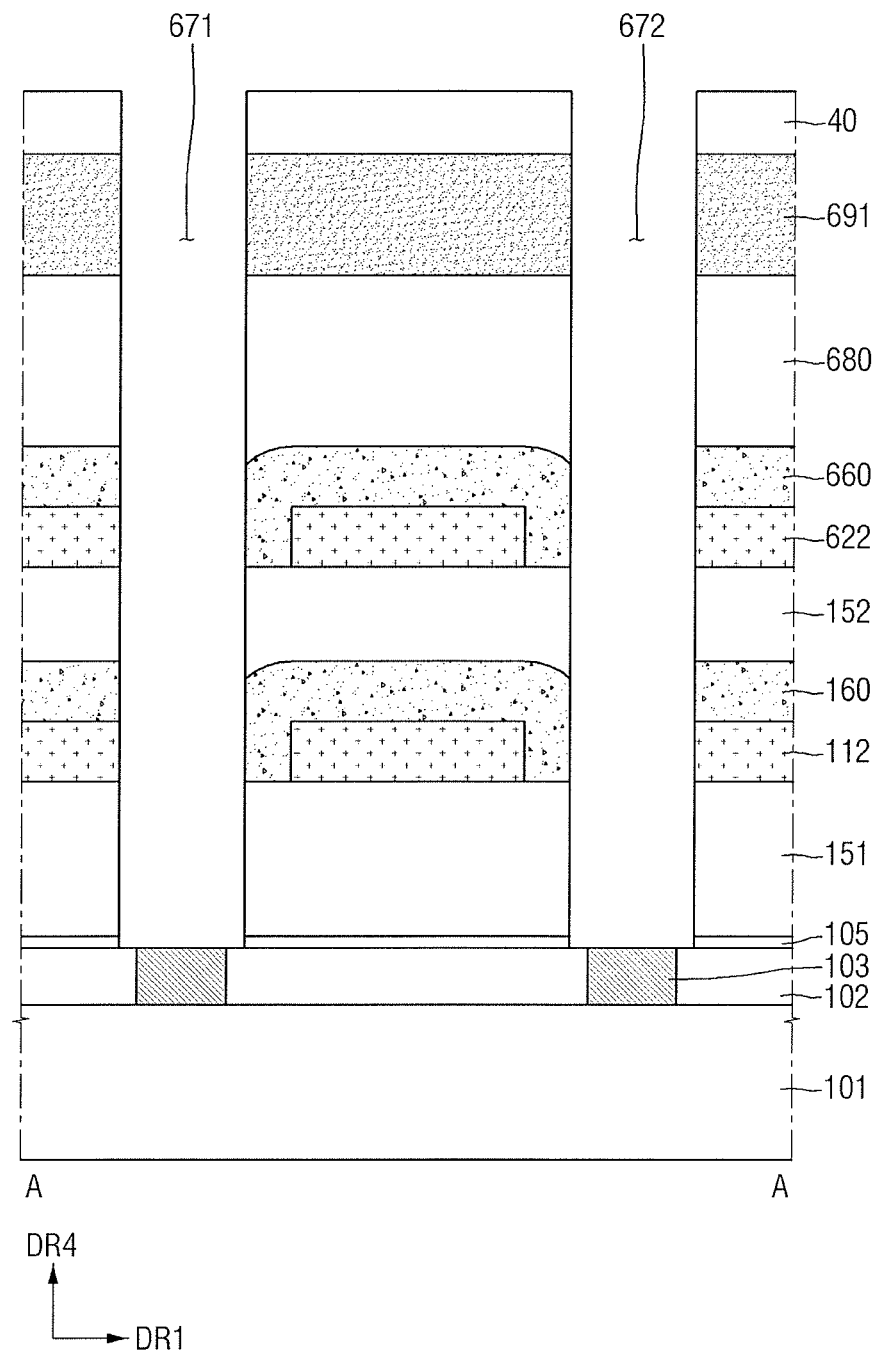

Referring to FIG. 27, the first contact hole 671 and the second contact hole 672 may be formed by performing the second dry etching on the third supporter layer 691, the third mold layer 680, the second insulating layer 660, at least a portion of the second supporter pattern 622, the second mold layer 152, the first insulating layer 160, at least a portion of the first supporter pattern 112, the first mold layer 151 and the etch stop layer 105 in utilization of a fourth mask pattern 40 formed on the third supporter layer 691 as a mask.

Etch selectivity of the second supporter pattern 622 and the second insulating layer 660 may be same as each other with respect to the second dry etching. That is, a third dry etching rate of the second supporter pattern 622 with respect to the second dry etching may be same as a fourth dry etching rate of the second insulating layer 660 with respect to the second dry etching. That is, when the second dry etching is performed, the second supporter pattern 622 and the second insulating layer 660 may be etched at a same speed.

Subsequently, the semiconductor device illustrated in FIG. 23 may be fabricated through a process of additionally removing the third mold layer 680 and the second insulating layer 660 in the process described in FIG. 11, after the processes described in FIG. 8 and FIG. 9 are performed.

Hereinafter, with reference to FIG. 28, a semiconductor device fabricated by a method for fabricating a semiconductor device according to some other exemplary embodiments will be described. The difference from the semiconductor device illustrated in FIG. 1 will be highlighted.

Figure 28:
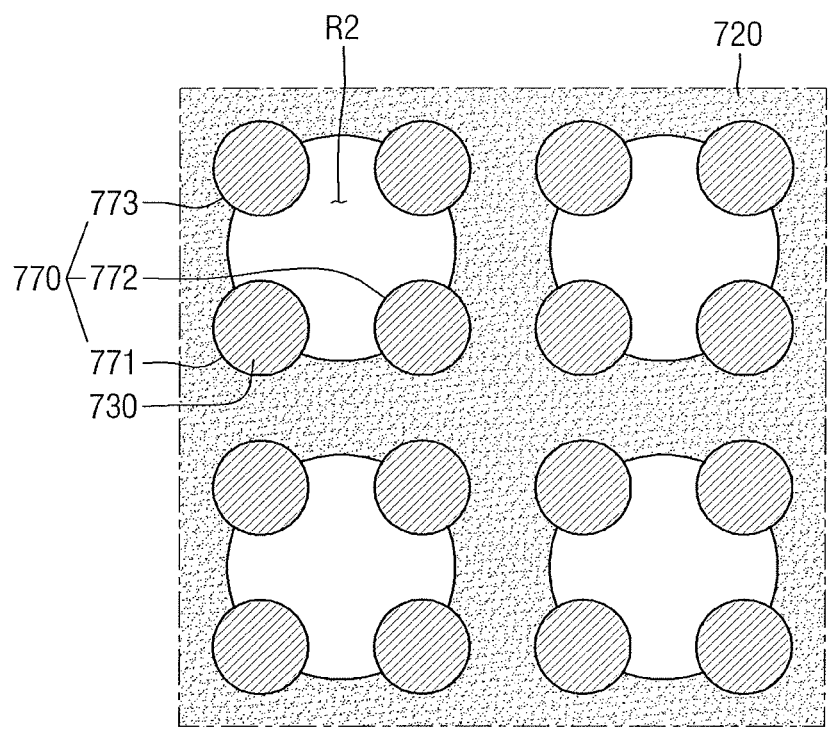
FIG. 28 illustrates a plan view of a semiconductor device fabricated by a method for fabricating a semiconductor device according to some other exemplary embodiments.

FIG. 28 is a view provided to explain a semiconductor device fabricated by a method for fabricating a semiconductor device according to some other exemplary embodiments.

Referring to FIG. 28, the semiconductor device may include a plurality of contact holes 770 which are disposed to be spaced apart from one another. For example, a second contact hole 772 may be disposed to be spaced apart from a first contact hole 771 in a first direction DR1. Further, the third contact hole 773 may be disposed to be spaced apart from the first contact hole 771 in a third direction DR3.

An angle formed by the first direction DR1 and the third direction DR3 may be vertical. In this case, each of the plurality of contact holes 770 may be disposed on a vertex of a rectangular shape.

The open region R2 of the second supporter 720 may have a circular shape. However, the present disclosure is not limited thereto. That is, in some other exemplary embodiments, the open region R2 of the second supporter 720 may have, e.g., a rectangular shape or a parallelogrammic shape. The lower electrode 730 may have a pillar shape to completely fill an inner portion of each of the plurality of contact holes 770.

Hereinafter, with reference to FIG. 29, a semiconductor device fabricated by a method for fabricating a semiconductor device according to some other exemplary embodiments will be described. The difference from the semiconductor device illustrated in FIG. 1 will be highlighted.

FIG. 29 is a view provided to explain a semiconductor device fabricated by a method for fabricating a semiconductor device according to some other exemplary embodiments.

Referring to FIG. 29, the semiconductor device may include a plurality of contact holes 870 which are disposed to be spaced apart from one another. For example, a second contact hole 872 may be disposed to be spaced apart from a first contact hole 871 in a first direction DR1. Further, the third contact hole 873 may be disposed to be spaced apart from the first contact hole 871 in a third direction DR3.

An angle formed by the first direction DR1 and the third direction DR3 may be vertical. In this case, each of the plurality of contact holes 870 may be disposed on a vertex of a rectangular shape.

The open region R2 of the second supporter 820 may have a circular shape. However, the present disclosure is not limited thereto. That is, in some other exemplary embodiments, the open region R2 of the second supporter 820 may have, e.g., a rectangular shape or a parallelogrammic shape.

The lower electrode 830 may have a cylinder shape conformally formed along a sidewall and a bottom surface of an inner portion of each of the plurality of contact holes 870.

By way of summation and review, as capacitance of a semiconductor element, e.g., DRAM, is increased, an aspect ratio of the cylinder type lower electrodes greatly increases. Accordingly, the cylinder type lower electrodes may tilt or break before a dielectric is deposited.

In contrast, the present disclosure provides a method for fabricating a semiconductor device that forms an insulating layer and a mold layer on a lower supporter pattern with a separate process, thereby preventing formation of voids between the lower supporter patterns. Further, the present disclosure also provides a method for fabricating a semiconductor device that form an insulating layer having no difference in etch selectivity of the dry etching from the lower supporter pattern on the lower supporter pattern, thereby preventing profile tilt phenomenon on a sidewall of a contact hole in an etching process in which a contact hole is formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
    stacking a first mold layer and a first supporter layer on a substrate, sequentially;
    forming a first supporter pattern by etching the first supporter layer so as to expose at least a portion of an upper surface of the first mold layer;
    forming an insulating layer so as to cover the exposed upper surface of the first mold layer and the first supporter pattern;
    stacking a second mold layer and a second supporter layer on the insulating layer, sequentially;
    forming a contact hole by dry-etching the second supporter layer, the second mold layer, the insulating layer, at least a portion of the first supporter pattern, and the first mold layer through a mask pattern;
    forming a lower electrode within the contact hole;
    removing the first mold layer, the second mold layer, and the insulating layer; and
    forming an upper electrode on the lower electrode and the first supporter pattern,
    wherein, during the dry-etching, a dry etching rate of the first supporter pattern is the same as a dry etching rate of the insulating layer.

2. The method as claimed in claim 1, wherein the first mold layer, the second mold layer, and the insulating layer are removed by wet etching, wet etching rates of the insulating layer and the first mold layer being the same.

3. The method as claimed in claim 2, wherein the insulating layer includes a same material as the first mold layer.

4. The method as claimed in claim 1, wherein the insulating layer and the second mold layer are formed by different processes from each other.

5. The method as claimed in claim 4, wherein the insulating layer is formed by an atomic layer deposition process, and the second mold layer is formed by a chemical vapor deposition process.

6. The method as claimed in claim 1, wherein the first supporter layer includes silicon oxycarbide (SiOC).

7. The method as claimed in claim 1, wherein, during the dry-etching, the dry etching rate of the first supporter pattern is the same as a dry etching rate of the first mold layer.

8. The method as claimed in claim 1, wherein the lower electrode is formed to completely fill an inner portion of the contact hole.

9. The method as claimed in claim 1, wherein the lower electrode is formed along a sidewall and a bottom surface of the contact hole, and the upper electrode is formed to fill an inner portion of the contact hole on the lower electrode.

10. The method as claimed in claim 1, wherein a lower surface of the insulating layer and a lower surface of the first supporter pattern are formed on a same plane.

11. A method for fabricating a semiconductor device, the method comprising:
   stacking a first mold layer and a first supporter layer on a substrate sequentially;
   forming a first supporter pattern by etching the first supporter layer so as to expose at least a portion of an upper surface of the first mold layer;
   forming a first insulating layer so as to cover the exposed upper surface of the first mold layer and the first supporter pattern;
   stacking a second mold layer, a second supporter layer, a third mold layer, and a third supporter layer on the first insulating layer sequentially;
   forming a contact hole by dry-etching the third supporter layer, the third mold layer, the second supporter layer, the second mold layer, the first insulating layer, at least a portion of the first supporter pattern, and the first mold layer through a mask pattern;
   forming a lower electrode within the contact hole; and
   removing the first mold layer, the second mold layer, the third mold layer, and the first insulating layer,
   wherein, during the dry-etching, a dry etching rate of the first supporter pattern is the same as a dry etching rate of the first insulating layer.

12. The method as claimed in claim 11, wherein sequentially stacking the second mold layer, the second supporter layer, the third mold layer, and the third supporter layer on the first insulating layer further includes:
   stacking the second mold layer and the second supporter layer on the first insulating layer sequentially;
   forming a second supporter pattern by etching the second supporter layer so as to expose at least a portion of an upper surface of the second mold layer;
   forming a second insulating layer to cover the exposed upper surface of the second mold layer and the second supporter pattern; and
   forming the third mold layer and the third supporter layer on the second insulating layer.

13. The method as claimed in claim 12, wherein forming the contact hole further includes dry-etching the second insulating layer, such that during the dry-etching a dry etching rate of the second supporter pattern is the same as a dry etching rate of the second insulating layer.

14. The method as claimed in claim 12, wherein the second insulating layer includes a same material as the second mold layer.

15. The method as claimed in claim 12, wherein the second supporter layer includes silicon oxycarbide (SiOC).

16. The method as claimed in claim 11, wherein the first insulating layer and the second mold layer are formed through a same process.

17. The method as claimed in claim 11, wherein a lower surface of the first insulating layer is formed closer to the substrate than a lower surface of the first supporter pattern.

18. A method for fabricating a semiconductor device, the method comprising:
   stacking a first mold layer and a first supporter layer including silicon oxycarbide (SiOC) on a substrate sequentially;
   forming a first supporter pattern by etching the first supporter layer so as to expose at least a portion of an upper surface of the first mold layer;
   stacking a second mold layer and a second supporter layer on the first supporter pattern sequentially;
   forming a contact hole by dry-etching the second supporter layer, the second mold layer, at least a portion of the first supporter pattern, and the first mold layer through a mask pattern;
   forming a lower electrode within the contact hole; and
   removing the first mold layer and the second mold layer,
   wherein, during the dry-etching, a dry etching rate of the first supporter pattern is the same as a dry etching rate of the first mold layer.

19. The method as claimed in claim 18, further comprising, after forming the first supporter pattern:
   forming an insulating layer so as to cover the exposed upper surface of the first mold layer and the first supporter pattern; and
   stacking the second mold layer and the second supporter layer on the insulating layer sequentially.

20. The method as claimed in claim 19, wherein forming the contact hole further includes dry-etching the insulating layer, such that the dry etching rate of the first supporter pattern is the same as a dry etching rate of the insulating layer.

* * * * *